United States Patent
Makino et al.

(10) Patent No.: US 10,005,328 B2
(45) Date of Patent: Jun. 26, 2018

(54) METHOD AND SYSTEM FOR ESTIMATING WEAR OF AXIALLY DIVIDED TREAD ZONES OF TIRE

(71) Applicant: Sumitomo Rubber Industries, Ltd., Kobe-shi, Hyogo (JP)

(72) Inventors: Shouta Makino, Kobe (JP); Ryota Tamada, Kobe (JP)

(73) Assignee: SUMITOMO RUBBER INDUSTRIES, LTD., Kobe-Shi, Hyogo (JP)

(*) Notice: Subject to any disclaimer, the term of this patent is extended or adjusted under 35 U.S.C. 154(b) by 401 days.

(21) Appl. No.: 14/741,613

(22) Filed: Jun. 17, 2015

(65) Prior Publication Data

US 2015/0375584 A1 Dec. 31, 2015

(30) Foreign Application Priority Data

Jun. 25, 2014 (JP) .................................. 2014-130598

(51) Int. Cl.
*G06G 7/48* (2006.01)
*B60C 99/00* (2006.01)
(Continued)

(52) U.S. Cl.
CPC .......... *B60C 99/006* (2013.01); *B60C 11/246* (2013.01); *G06F 17/5018* (2013.01)

(58) Field of Classification Search
CPC .. B60C 99/006; B60C 11/246; G06F 17/5018
(Continued)

(56) References Cited

FOREIGN PATENT DOCUMENTS

| EP | 0919941 A2 | 6/1999 |
| EP | 0953834 A2 | 11/1999 |

(Continued)

OTHER PUBLICATIONS

Extended European Search Report for European Application No. 15173276.5, dated Oct. 28, 2015.

*Primary Examiner* — Saif A Alhija
(74) *Attorney, Agent, or Firm* — Birch, Stewart, Kolasch & Birch, LLP

(57) ABSTRACT

A method for estimating wear of each of circumferential tread zones of a tire by the use of a computer is disclosed. A tire model of the tire comprising model's circumferential tread zones is defined. A simulation for running the tire model under rolling conditions for free-rolling, braking, driving and cornering is performed to obtain a first average wear energy of each model's circumferential tread zone under each rolling condition. With respect to a given running pattern of the tire, occurrence frequencies of the respective rolling conditions occurring in the running pattern are defined. For each circumferential tread zone, a second average wear energy of the concerned circumferential tread zone when the tire is run according to the running pattern is calculated such that the first average wear energies under the respective rolling conditions, of the model's circumferential tread zone of the concerned circumferential tread zone are respectively weighted by the occurrence frequencies of the respective rolling conditions. Wear of each circumferential tread zone is estimated based on the calculated second average wear energy of the concerned circumferential tread zone.

5 Claims, 16 Drawing Sheets

(51) Int. Cl.
*G06F 17/50* (2006.01)
*B60C 11/24* (2006.01)

(58) Field of Classification Search
USPC .............................................................. 703/6
See application file for complete search history.

(56) References Cited

FOREIGN PATENT DOCUMENTS

| | | | |
|---|---|---|---|
| EP | 1245411 A2 | | 10/2002 |
| EP | 0919941 B1 | * | 9/2005 |
| EP | 2241456 A1 | | 10/2010 |
| JP | 8-128937 A | | 5/1996 |
| JP | 2001-001723 A | | 1/2001 |

\* cited by examiner

METHOD AND SYSTEM FOR ESTIMATING WEAR OF AXIALLY DIVIDED TREAD ZONES OF TIRE

BACKGROUND OF THE INVENTION

The present invention relates to a computer-implemented simulation method for estimating wear of a tire and a computer system, capable of accurately estimating wear of each of axially divided tread zones of the tread portion under arbitrary actual running conditions of the tire.

As well known in the tire art, tread wear of a tire especially a pneumatic tire includes various uneven wear such as: crown wear—a crown portion of the tread is worn more than other portion; both-side shoulder wear—both shoulder portions are worn more than the crown portion therebetween; one-side shoulder wear—one of tread shoulder portions is worn more than other portion; railway wear—tread is worn in two parallel lines along a circumferential groove, and the like.

In Japanese Patent Application Publication No. 2001-1723 (patent document 1), a method for predicting tire wear is disclosed. In this method, wear energies of a tire under several measuring conditions are measured by the use of an indoor testing machine.

This indoor testing machine for measuring wear energy is disclosed in Japanese Patent Application Publication No. H8(1996)-128937, wherein sensors for wear energy are aligned in line in the tire circumferential direction at one axial position, and the test tire rolls on a reciprocating flat table.

Thus, the wear energy is measured at only one axial position, and the rolling of the tire is not continuous. Further, the surface of the table may be largely different from the actual road surfaces. Accordingly, it is difficult to accurately estimate a wear amount of a tire. Especially, it is almost impossible to estimate the above-mentioned uneven wear occurring in the tire circumferential direction at different axial positions.

SUMMARY OF THE INVENTION

It is therefore, an object of the present invention to provide a computer-implemented method and a computer system capable of accurately estimating wear of each of axially divided tread zones of a tire under arbitrary running conditions.

According to the present invention, a method for estimating wear of each of circumferential tread zones of a tread portion of a tire by the use of a computer, comprises:

a process in which a tire model of the tire made up of a finite number of elements and comprising model's circumferential tread zones of the respective circumferential tread zones is defined in the computer, a process in which a simulation for running the tire model under respective rolling conditions for free-rolling, braking, driving and cornering is performed by the computer to obtain a first average wear energy of each model's circumferential tread zone under each rolling condition, an occurrence frequency defining process in which, with respect to a given running pattern of the tire, occurrence frequencies of the respective rolling conditions occurring in the running pattern are defined in the computer, a process in which, for each circumferential tread zone, a second average wear energy of the concerned circumferential tread zone when the tire is run according to the running pattern is calculated by the computer such that the first average wear energies under the respective rolling conditions, of the model's circumferential tread zone of the concerned circumferential tread zone are respectively weighted by the occurrence frequencies of the respective rolling conditions, and a wear calculating process in which, wear of each circumferential tread zone is estimated by the computer based on the calculated second average wear energy of the concerned circumferential tread zone.

The wear calculating process may include a process for calculating an estimated wear of each circumferential tread zone by using the second average wear energy of the concerned circumferential tread zone and a wear index of a rubber material constituting the concerned circumferential tread zone, wherein the wear index is a ratio of an amount of wear of the rubber material to a wear energy causing the wear on the rubber material.

The occurrence frequencies of the respective rolling conditions may be determined through a multiple linear regression analysis method based on the first average wear energies of the model's circumferential tread zones, and actual wear amounts of the circumferential tread zones obtained by running the tire.

The occurrence frequencies of the respective rolling conditions may be determined based on a generation frequency of left-and-right acceleration applied to the tire, and a generation frequency of back-and-forth acceleration applied to the tire, which are obtained by running the tire.

According to the present invention, a computer system comprising an arithmetic processing unit for estimating wear of each of circumferential tread zones of a tread portion of a tire, wherein the arithmetic processing unit comprises:

a tire model defining part for defining a tire model of the tire made up of a finite number of elements and comprising model's circumferential tread zones of the respective circumferential tread zones, a first wear energy calculating part for performing a simulation for running the tire model under respective rolling conditions for free-rolling, braking, driving and cornering, and obtaining a first average wear energy of each model's circumferential tread zone under each rolling condition, a occurrence frequency calculating part for defining occurrence frequencies of the respective rolling conditions occurring in a given running pattern of the tire, a second wear energy calculating part for calculating a second average wear energy of each circumferential tread zone when the tire is run according to the given running pattern such that the first average wear energies under the respective rolling conditions, of the model's circumferential tread zone of the concerned circumferential tread zone are respectively weighted by the occurrence frequencies of the respective rolling conditions, and a wear amount calculating part for estimating wear of each circumferential tread zone based on the calculated second average wear energy of the concerned circumferential tread zone.

DESCRIPTION OF THE PREFERRED EMBODIMENTS

Embodiments of the present invention will now be described in detail in conjunction with the accompanying drawings.

In the method according to the present invention, wear of a tire 2 occurring when rolling on road surfaces under various conditions is estimated by the use of a computer system 1A.

Figure 2:
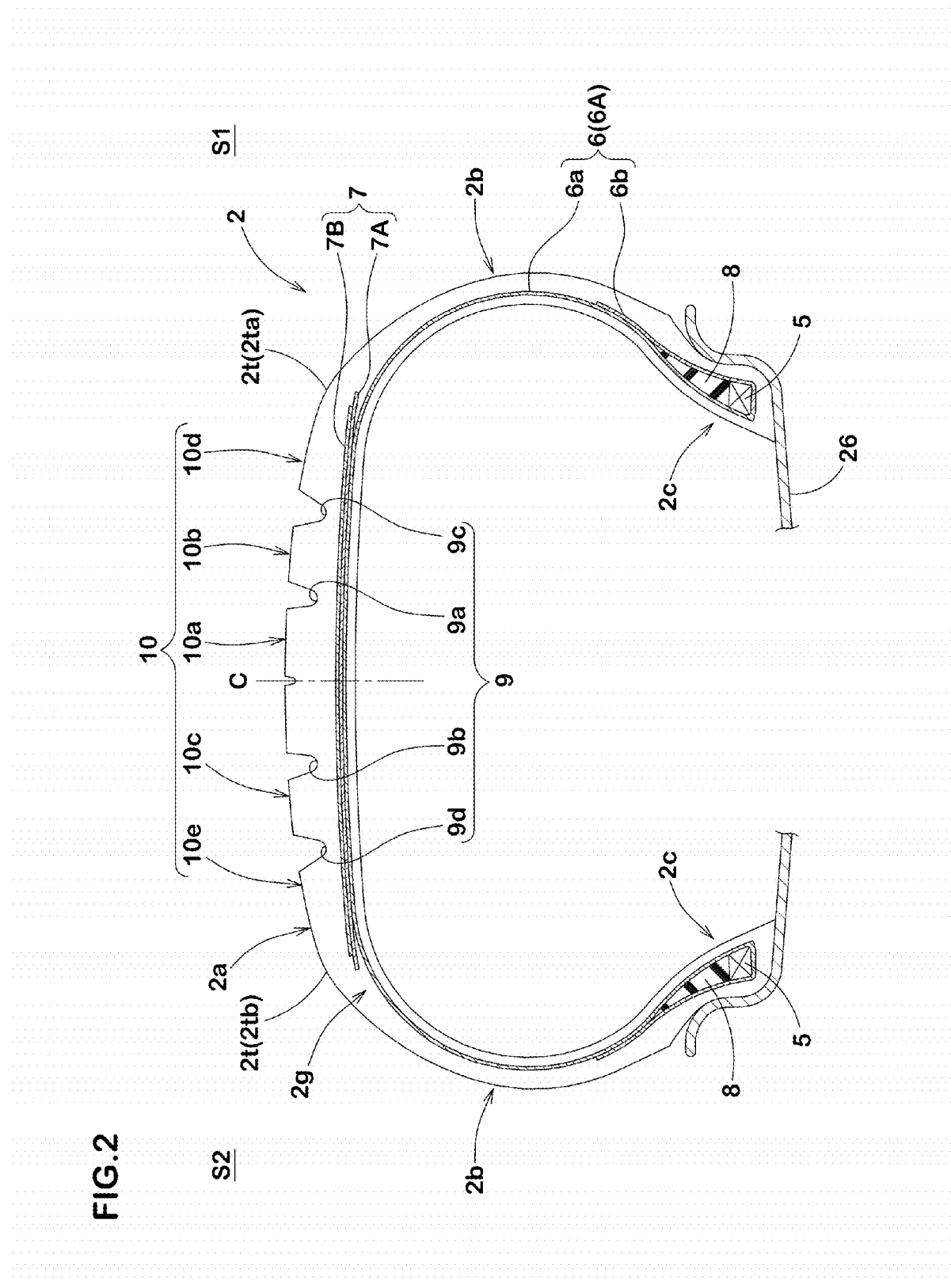
FIG. 2 is a cross sectional view of a pneumatic tire used an example of the tire whose wear is estimated by the method in this embodiment.

In FIG. 2 showing an example of the tire 2, the tire 2 is a pneumatic tire comprising a carcass 6 extending between bead cores 5 of bead portions 2c through a tread portion 2a and sidewall portions 2b, and a tread reinforcing belt 7 disposed radially outside the carcass 6 in the tread portion 2a. The carcass 6 is composed of at least one ply 6A, in this example only one ply, of cords arranged radially at an angle in a range of from 75 to 90 degrees with respect to the tire equator C, extending between the bead portions 2c through the tread portion 2a and sidewall portions 2b and turned up around the bead core 5 in each bead portion 2c from the axially inside to the axially outside of the tire to form a pair of turnup portions 6b and a main portion 6a therebetween. The belt 7 comprises at least two cross breaker plies 7A and 7B of cords laid at an angle of from 10 to 35 degrees with respect to the tire equator C.

Between the main portion 6a and each turned up portion 6b, a bead apex rubber 8 extending radially outwardly from the bead core 5 is disposed.

The tread portion 2a is provided with a tread pattern comprising at least one circumferentially continuously extending groove 9 so as to axially divided the tread portion 2a into circumferential tread zones 10.

Figure 3:
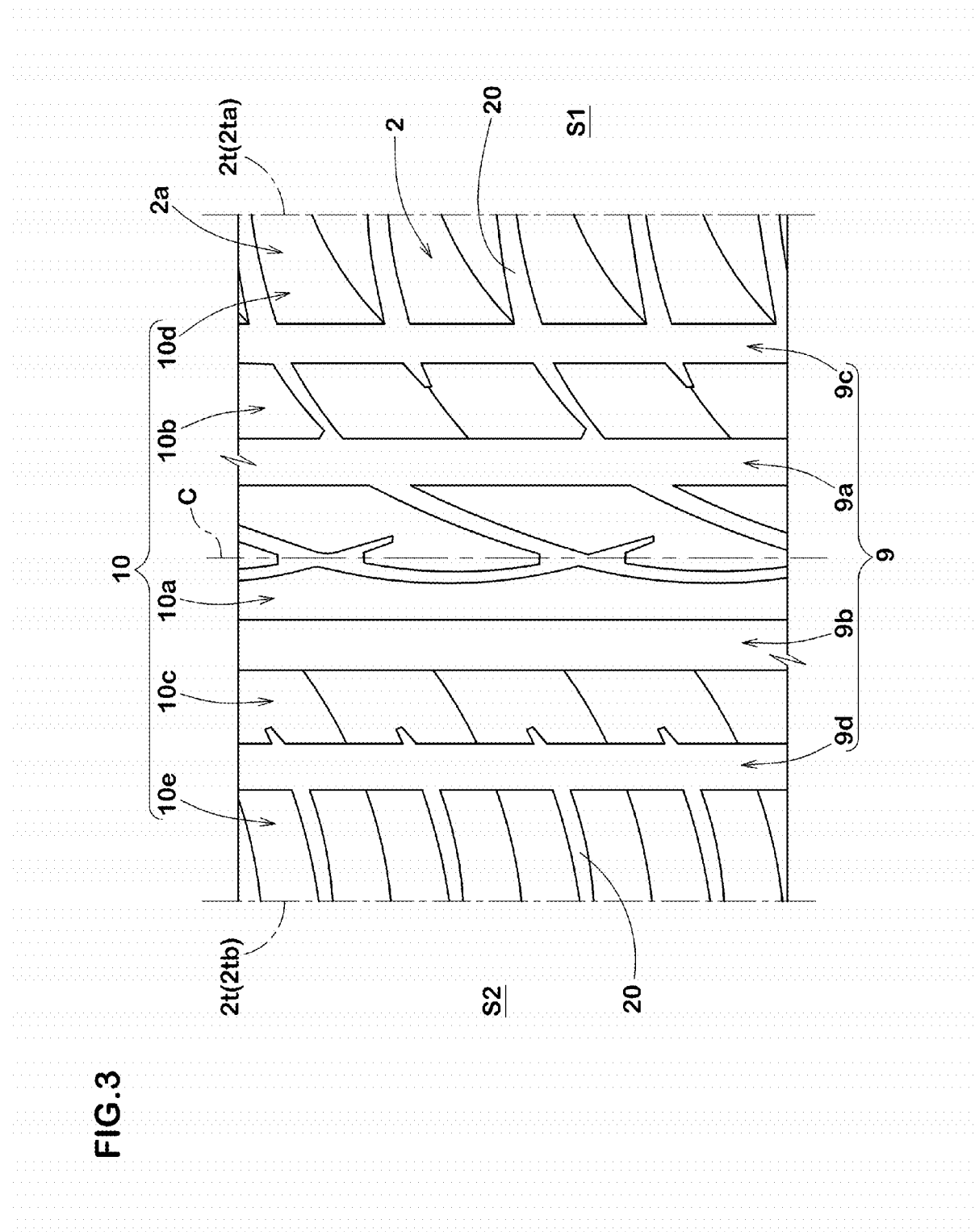
FIG. 3 is a developed partial view showing the tread portion of the pneumatic tire.

In FIG. 3 showing an example of the tread pattern, the tread portion 2a is provided with more than one circumferential groove 9. In this example, the circumferential grooves 9 include: a first crown circumferential groove 9a disposed on one side S1 of the tire equator in the tire axial direction; a second crown circumferential groove 9b disposed on the other side S2 of the tire axial direction; a first shoulder circumferential groove 9c disposed on the side S1 of the tire equator in the tire axial direction; and a second shoulder circumferential groove 9d disposed on the side S2 of the tire axial direction.

Accordingly, the circumferential tread zones 10 in this example include: a center circumferential tread zone 10a defined between the grooves 9a and 9b; a first middle circumferential tread zone 10b between the grooves 9a and 9c disposed on the side S1 of the tire equator C; a first shoulder circumferential tread zone 10d between the groove 9c and the tread edges 2ta disposed on the side S1 of the tire equator C; a second middle circumferential tread zone 10c between the grooves 9b and 9d disposed on the other side S2 of the tire equator C; and a second shoulder circumferential tread zone 10e between the groove 9d and the tread edges 2tb disposed on the side S2 of the tire equator C. Further, the circumferential tread zones 10 are provided with lateral grooves 20.

In this specification, the tread edges 2t are the axial outermost edges of the ground contacting patch of the tire 2 which occurs under a normally inflated loaded condition of the tire when the camber angle of the tire is zero.

The normally inflated loaded condition is such that the tire is mounted on the standard wheel rim and inflated to the standard pressure and loaded with the standard tire load.

The standard wheel rim is a wheel rim officially approved or recommended for the tire by standards organizations, i.e. JATMA (Japan and Asia), T&RA (North America), ETRTO (Europe), TRAA (Australia), STRO (Scandinavia), ALAPA (Latin America), ITTAC (India) and the like which are effective in the area where the tire is manufactured, sold or used.

The standard pressure and the standard tire load are the maximum air pressure and the maximum tire load for the tire specified by the same organization in the Air-pressure/Maximum-load Table or similar list. For example, the standard wheel rim is the "standard rim" specified in JATMA, the "Measuring Rim" in ETRTO, the "Design Rim" in TRA or the like. The standard pressure is the "maximum air pressure" in JATMA, the "Inflation Pressure" in ETRTO, the maximum pressure given in the "Tire Load Limits at Various Cold Inflation Pressures" table in TRA or the like. In case of passenger car tires, however, the standard pressure is uniformly defined by 180 kPa. The standard load is the "maximum load capacity" in JATMA, the "Load Capacity" in ETRTO, the maximum value given in the above-mentioned table in TRA or the like.

Figure 1:
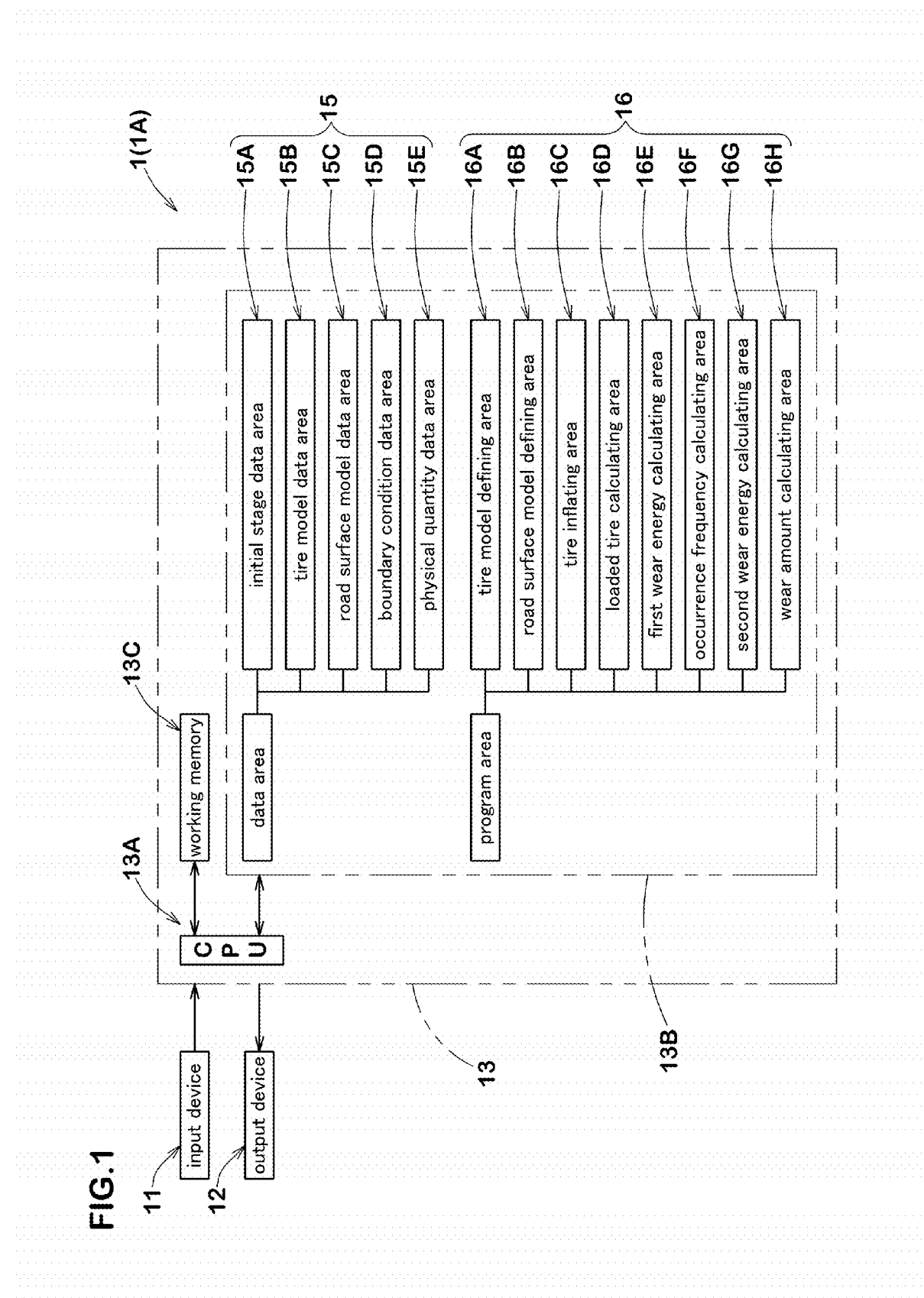
FIG. 1 is a block diagram of a computer system implementing a method as an embodiment of the present invention.

The computer system 1A implementing the method in this embodiment includes a computer 1 comprising, as shown in FIG. 1, an input device 11, an output device 12, an arithmetic processing unit 13 for computing physical quantities of the tire and so forth. As to the input device 11, for example, a keyboard, a mouse and the like can be used alone or in combination. As to the output device 12, for example, a display, a printer and the like can be used alone or in combination.

The arithmetic processing unit 13 comprises a central processing unit (CPU) 13A, a memory device 13B storing various data, software programs and the like, and a working memory 13C.

As to the memory device 13B, an involatile storage device, for example, a magnetic disk drive, an optical disk drive, a solid state drive and the like can be used.

The memory device 13B comprises a data area 15 and a program area 16.

The data area 15 include:
an initial stage data area 15A in which data about the tire to be evaluated and a road surface on which the tire rolls (for example, CAD data) are stored;
a tire model data area 15B in which data about a tire model of the tire are stored;
a road surface model data area 15C in which data about a road surface model of the road surface are stored;
a boundary condition data area 15D in which data about boundary conditions used in simulation are stored; and
a physical quantity data area 15E in which data about physical quantities calculated by the central processing unit 13A are stored.

In the program area 16, a program to be executed by the central processing unit 13A (the method in this embodiment) is stored.

The program area 16 includes:
a tire model defining area 16A in which a subprogram for defining the tire model is stored;
a road surface model defining area 16B in which a subprogram for defining the road surface model is stored;
an tire inflating area 16C in which a subprogram for calculating a shape of the tire model after an inner pressure is applied, is stored; and
a loaded tire calculating area 16D in which a subprogram for defining a load applied to the tire model after the inner pressure is applied, is stored.

Further, the program area 16 includes
a first wear energy calculating area 16E,
a occurrence frequency calculating area 16F,
a second wear energy calculating area 16G, and
a wear amount calculating area 16H.

Figure 4:
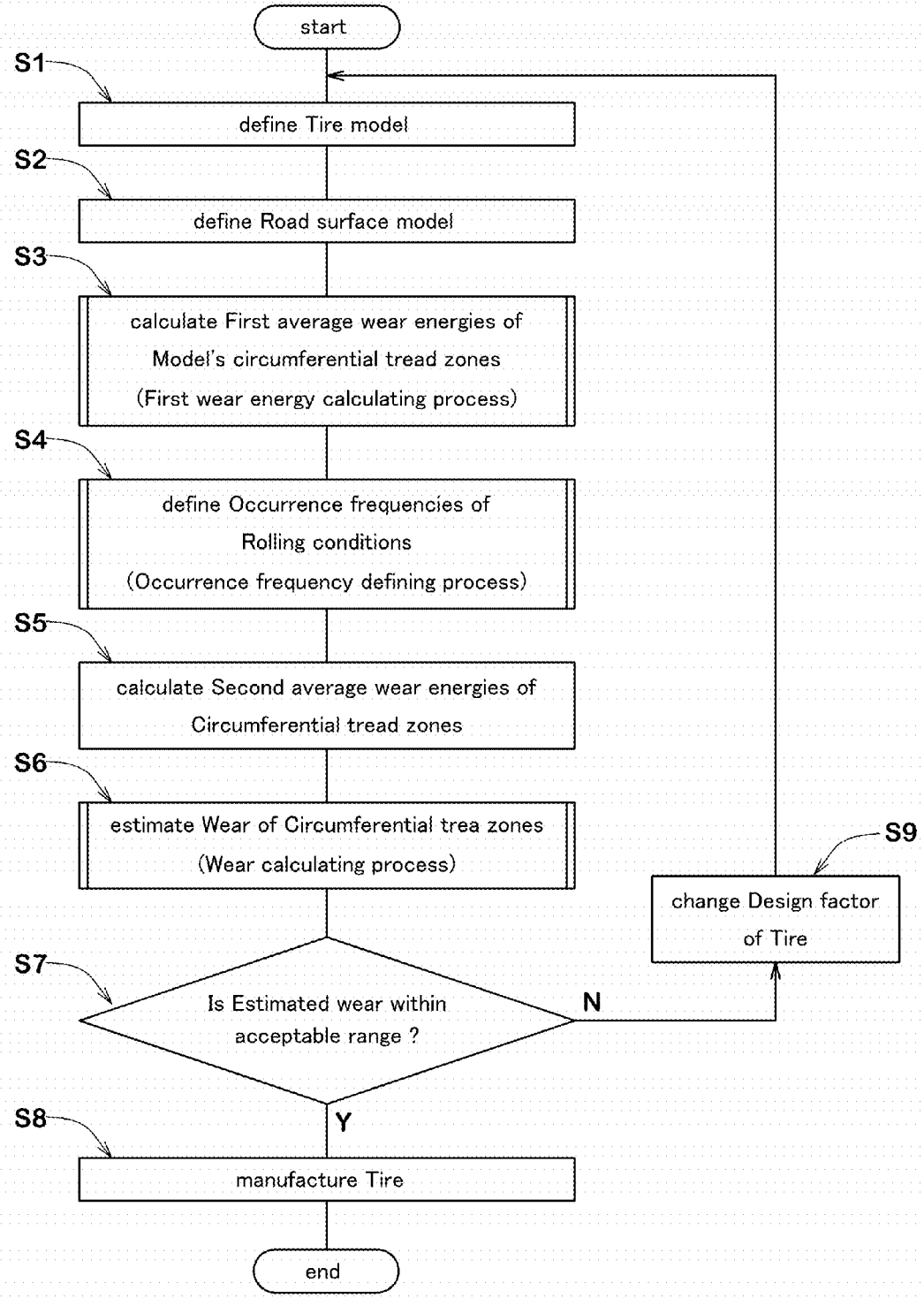
FIG. 4 shows a method as an embodiment of the present invention.

FIG. 4 shows an embodiment of the method according to the present invention.

Process S1

In the method in this embodiment, a tire model of the tire 2 is defined in the computer 1. (Process S1)

In this process S1, as shown in FIG. 1, the data about the tire 2 (for example, the contour of the tire 2) stored in the initial stage data area 15A are loaded in the working memory 13C. Further, the tire model defining area 16A (subprogram therein) is read in the working memory 13C and executed by the central processing unit 13A.

Figure 5:
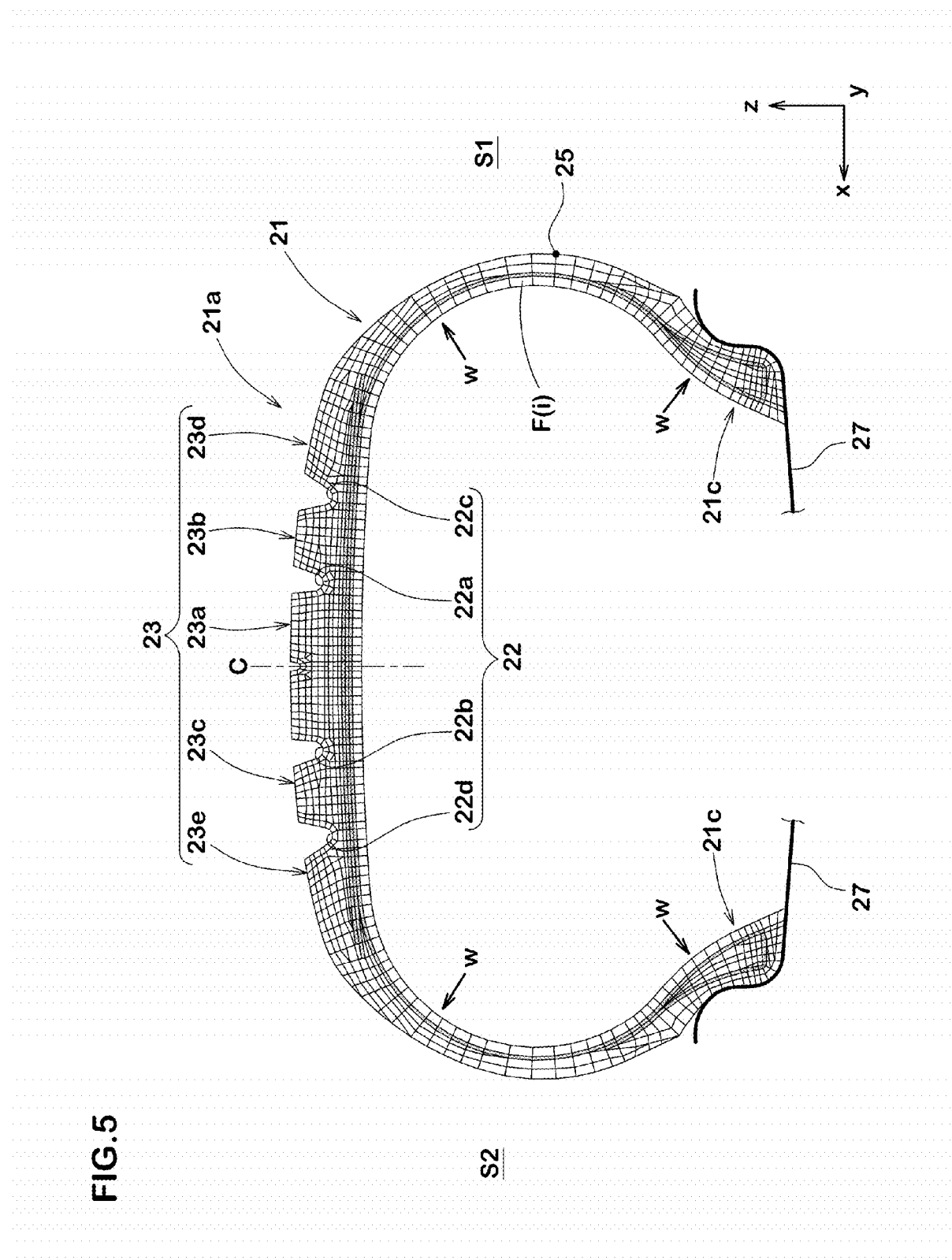
FIG. 5 shows a numerical tire model of the pneumatic tire rendered as its cross sectional view.

As a result, in the process S1, based on the data about the tire 2, there is defined a tire model 21 (as shown in FIG. 5) of the tire 2 made up of a finite number of elements $F(i)(i=1, 2, ---)$ processable by a numerical analysis method such as finite element method, finite volume method, difference method and boundary element method. In this embodiment, a finite element method is employed as a numerical analysis method.

Such tire model 21 is stored in the tire model data area 15B.

As to the elements F(i), solid elements, e.g. tetrahedral solid elements, pentahedral solid elements, hexahedral solid elements and the like can be preferably used. Each element F(i) has more than one node 25.

On each element F(i), there are defined numerical data including, for example, an identification number of the element, identification numbers and coordinates of the respective nodes 25, material characteristics (for example, density, Young's modulus and/or damping factor) and the like.

Figure 6:
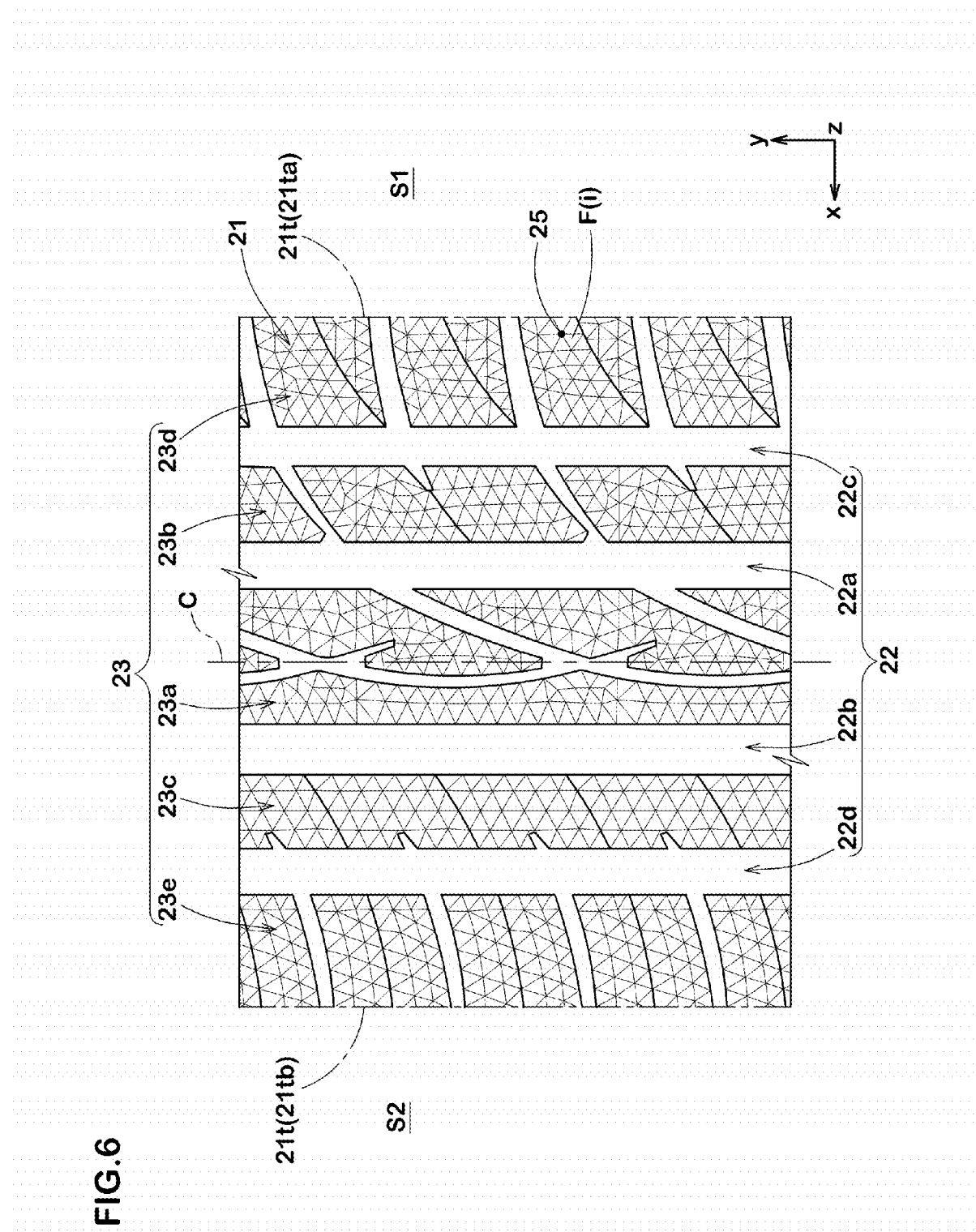
FIG. 6 shows the tread portion (corresponding to FIG. 3) of the tire model shown in FIG. 5.

In the tread portion 21a of the tire model 21, there are defined model's circumferential grooves 22 (22a, 22b, 22c, 22d) of the circumferential grooves 9 (9a, 9b, 9c, 9d), and model's circumferential tread zones 23 (23a, 23b, 23c, 23d, 23e) of the circumferential tread zones 10 (10a, 10b, 10c, 10d, 10e) as shown in FIG. 6 where mesh or elements of the grooved parts are omitted in order that the groove models and tread zone models can be easily identified.

Process S2

In the method in this embodiment, a road surface model of the road surface is defined in the computer 1. (Process S2)

In this process S2, the data about the road surface stored in the initial stage data area 15A are loaded in the working memory 13C. Further, the road surface model defining area 16B (subprogram therein) is read in the working memory 13C, and executed by the central processing unit 13A.

Figure 7:
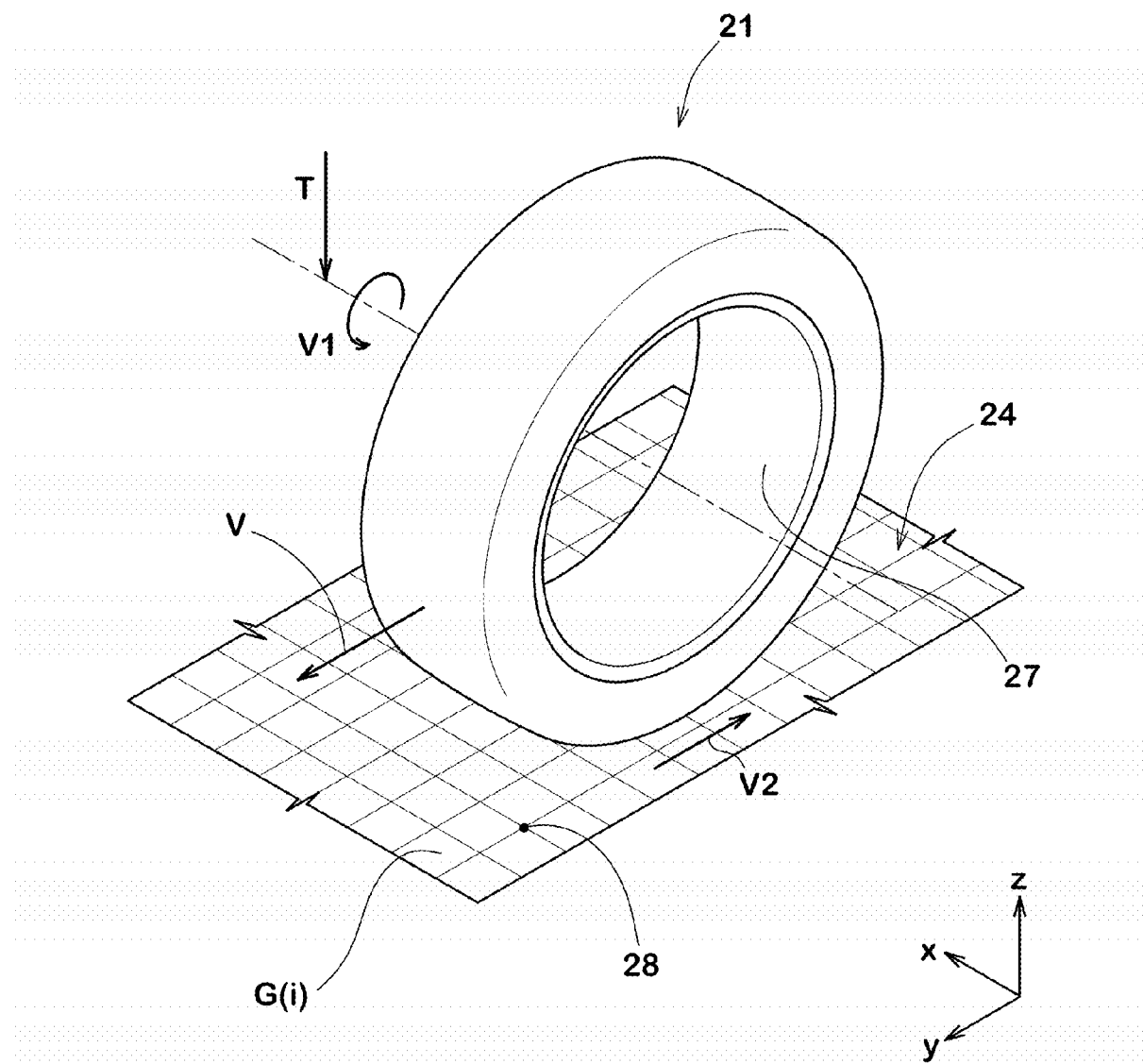
FIG. 7 is a diagram showing the tire model on a road surface model.

As a result, in the process S2, based on the data about the road surface, there is defined the road surface model 24 made up of a finite number of elements $G(i)(i=1, 2, ---)$ processable by a numerical analysis method (in this embodiment, finite element method) as shown in FIG. 7. Such road surface model 24 is stored in the road surface model data area 15C.

In the road surface model, each element G(i) is a rigid plane element defined as being undeformable. Each element G(i) has more than one node 28.

On each element G(i), there are defined numerical data including, for example, an identification number of the element, and identification numbers and coordinates of the respective nodes 28.

In the example shown in FIG. 7, the road surface model 24 is illustrated as being flat. But, of course, it is possible to define the road surface model 24 as being not flat to simulate an actual road surface by forming, for example, bumps, dents, undulation, ruts, small irregularities like those of asphalt road surfaces.

Process S3

In the method in this embodiment, next, with the computer 1, a first average wear energy of each of the model's circumferential tread zones 23a-23e of the tire model 21 during rolling on the road surface model 24 is calculated. (First wear energy calculating process S3)

In this process S3, a simulation for rolling the tire model is performed under various rolling conditions for free-rolling, braking, accelerating or driving, and turning or cornering, and the first average wear energies under the respective conditions, of each of the model's circumferential tread zones 23a-23e are calculated.

Figure 8:
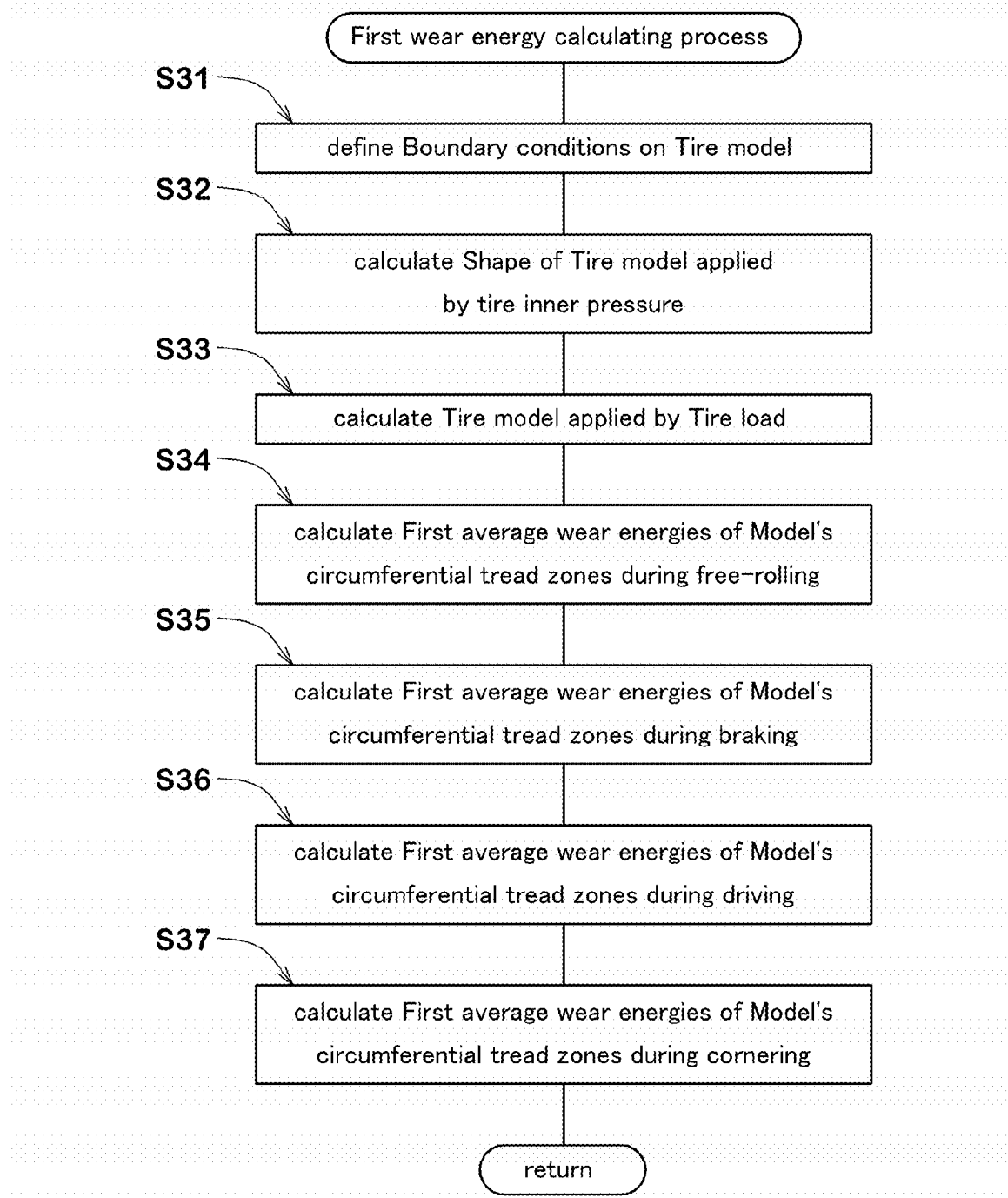
FIG. 8 is a flowchart of a first wear energy calculating process of the method in this embodiment.

FIG. 8 shows a flowchart of this process S3.

Process S31

In the first wear energy calculating process S3, boundary conditions are defined on the tire model 21.

(Process S31)

For example, the boundary conditions include a tire inner pressure, a tire load T and a camber angle of the tire model 21, and a coefficient of friction between the tire model 21 and the road surface model 24.

Further, the boundary conditions include an angular velocity V1 and a translational velocity V2 corresponding to a traveling speed V of the tire model, and a turning (or cornering) angle. Here, the translational velocity V2 is that in the ground contacting patch of the tire model 21.

Thus, the angular velocity V1 includes an angular velocity V1a during free-rolling, an angular velocity V1b during braking, an angular velocity V1c during driving, and an angular velocity V1d during cornering.

The translational velocity V2 includes a translational velocity V2a during free-rolling, a translational velocity V2b during braking, a translational velocity V2c during driving, and a translational velocity V2d during cornering.
Such boundary conditions are stored in the boundary condition data area 15D.

Process S32

In the process S3, a shape of the tire model 21 after applied by the tire inner pressure is calculated. (Process S32)

In this process S32, the tire model 21 stored in the tire model data area 15B and the inner pressure stored in the boundary condition data area 15D are read in the working memory 13C. Further, the tire inflating area 16C (subprogram therein) is read in the working memory 13C, and executed by the central processing unit 13A.
As a result, firstly, the bead portions 21c of the tire model 21 are restrained by a wheel rim model 27 of a wheel rim 26 as shown in FIG. 5.
Then, by applying a distribution load w corresponding to the tire inner pressure to the inside of the tire model 21, a deformation calculation of the tire model 21 is performed to obtain the tire model 21 after applied by the inner pressure.
In the deformation calculation of the tire model 21, matrixes of the elements F(i): mass matrix, rigidity matrix and damping matrix, are created based on the shapes of the elements F(i), material characteristics defined thereon and the like. Then, a system matrix representing the entire system is created from these matrixes, and by assigning various conditions, a motion equation is created by the computer 1.
using the motion equation, the deformation calculation of the tire model 21 is performed at time steps Tx (x=0, 1, - - - ). Incidentally, the time steps can be arbitrarily determined according to required simulation accuracy. The deformation calculation (including the after-mentioned rolling calculation) can be made, for example, by using a commercially available finite element analysis application software such as "LS-DYNA".

Process S33

In the process S3, the tire model 21 applied by the tire load is calculated. (Process S33)

In this process S33, the tire load, the camber angle and the coefficient of friction stored in the boundary condition data area 15D are read in the working memory 13C. Further, the loaded tire calculating area 16D (subprogram therein) is read in the working memory 13C, and executed by the central processing unit 13A.
As a result, in the process S33, a simulation for contacting the tire model 21 applied by the inner pressure with the road surface model 24 as shown in FIG. 7 is performed, and deformation of the tire model 21 is calculated based on the tire load T, the camber angle and the coefficient of friction.

Process S34

In the process S3, next, a first average wear energy of each of the model's circumferential tread zones 23a to 23e during free-rolling is calculated. (Process S34)

In this process S34, the angular velocity V1a and the translational velocity V2a during free-rolling stored in the boundary condition data area 15D are read in the working memory 13C. Further, the first wear energy calculating area 16E, namely, a subprogram therein for calculating the first wear energy of the tire model 21 is read in the working memory 13C, and executed by the central processing unit 13A.
As a result, in the process S34, firstly, as shown in FIG. 7, the angular velocity V1a during free-rolling is defined on the tire model 21, and the translational velocity V2a is defined on the road surface model 24 in order to calculate the tire model 21 free-rolling on the road surface model 24.
More specifically, during the nodes 25 of the model's circumferential tread zones 23a to 23e contact with the road surface model 24, a shearing force P and slippage Q at each node 25 are calculated through a free-rolling simulation or calculation.
Here, the shearing force P includes a shearing force Px in the tire axial direction x and a shearing force Py in the tire circumferential direction y.
The slippage Q includes a slippage Qx in the tire axial direction x and a slippage Qy in the tire circumferential direction y corresponding to the shearing forces Px and Py, respectively.
The free-rolling calculation is made plural times at intervals of a unit time from the beginning to the end of the free-rolling. Thereby, in the process S34, the calculation of the shearing forces Px, Py and slippages Qx, Qy at the nodes 25 is made plural times at intervals of a unit time from the beginning to the end of the free-rolling.
Further, for each of the model's circumferential tread zones 23a to 23e, the product Px(i) and Qx(i) and the product Py(i) and Qy(i) of each node 25 therein are respectively integrated for the period during the concerned node 25 exists in the ground contacting patch.
Then, with respect to all of the nodes 25 in each model's circumferential tread zone 23, the two integrated values obtained for each node 25 are summed, and
a quotient of the summed value divided by the ground contacting area of the concerned model's circumferential tread zone 23 is computed as an average wear energy during a unit time.
Then, the average wear energy during a unit time is accumulated from the beginning to the end of the rolling of the tire. Further, the accumulated value is divided by the elapsed time from the beginning to the end of the rolling of the tire. Thereby, for each of the model's circumferential tread zones 23a to 23e, the first average wear energy during free-rolling is obtained and stored in the physical quantity data area 15E.

Figure 9:
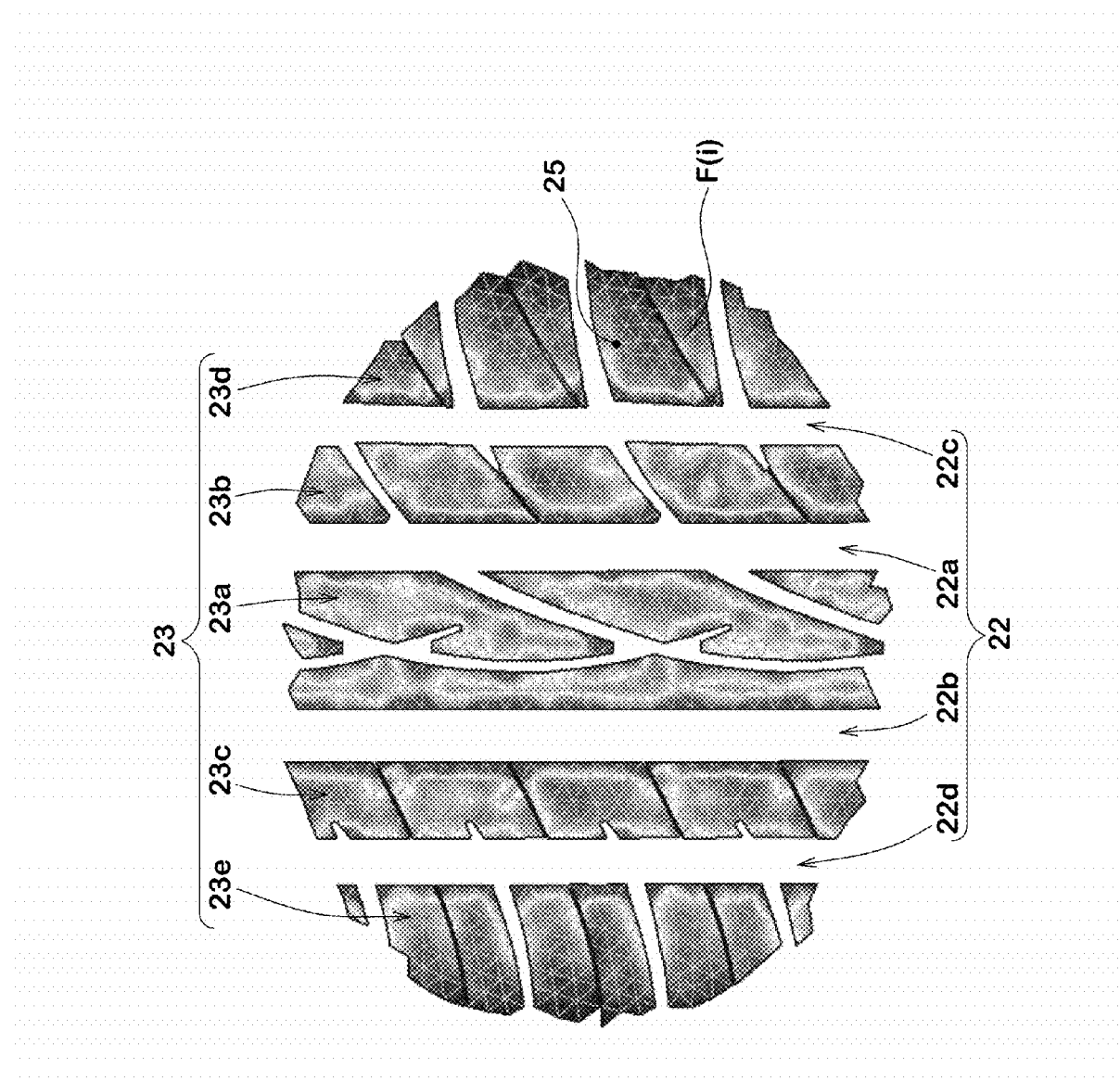
FIG. 9 is a ground contacting patch of the tire showing a distribution of calculated wear energy during free-rolling.

FIG. 9 shows a tire footprint showing a distribution of the wear energies during free-rolling, wherein the magnitudes of the wear energies are indicated by gray scale (originally, by color mapping). As to parts other than the nodes 25, the wear energies are calculated through interpolation based on the data at the nodes 25.
Such post processing (including color mapping) of the data may be carried out by the use of a general-purpose post-processor such as "LS-PrePost" of LSTC.

Process S35

In the process S3, further, a first average wear energy of each of the model's circumferential tread zones 23a to 23e during braking is calculated. (Process S35)

In this process S35,
the angular velocity V1a and the translational velocity V2a during free-rolling and the angular velocity V1b and the translational velocity V2b during braking stored in the boundary condition data area 15D are read in the working memory 13C. Further, the first wear energy calculating area 34 is read in the working memory 13C, and executed by the central processing unit 13A.
As a result, in the process S35, the angular velocity V1a during free-rolling is defined on the tire model 21, and the translational velocity V2a during free-rolling is defined on the road surface model 24. Then, the angular velocity V1b during braking is defined on the tire model 21, and the translational velocity V2b during braking is defined on the road surface model 24 in order to make it possible to calculate the tire model 21 under such a situation that the brake is applied when making free-rolling.

In the process S35, the calculation of the shearing forces Px, Py and slippages Qx, Qy at the nodes 25 is made plural times at intervals of a unit time from the beginning to the end of the braking.

In the same way as in the process S34, the first average wear energy during braking is calculated for each of the model's circumferential tread zones 23a to 23e, and stored in the physical quantity data area 15E.

Process S36

In the process S3, further, a first average wear energy of each of the model's circumferential tread zones 23a to 23e during driving is calculated. (Process S36)

In this process S36, the angular velocity V1a and the translational velocity V2a during free-rolling and the angular velocity V1c and the translational velocity V2c during driving stored in the boundary condition data area 15D are read in the working memory 13C.

Further, the first wear energy calculating area 16E is read in the working memory 13C, and executed by the central processing unit 13A.

As a result, in the process S36, the angular velocity V1a during free-rolling is defined on the tire model 21, and the translational velocity V2a during free-rolling is defined on the road surface model 24.

Then, the angular velocity V1c during driving is defined on the tire model 21, and the translational velocity V2c during driving is defined on the road surface model 24 in order to make it possible to calculate the tire model under such a situation that the speed is increased when making free-rolling.

In the process S36, the calculation of the shearing forces Px, Py and slippages Qx, Qy at the nodes 25 is made plural times at intervals of a unit time from the beginning to the end of the driving.

In the same way as in the process S34, the first average wear energy during driving or accelerating is calculated for each of the model's circumferential tread zones 23a to 23e, and stored in the physical quantity data area 15E.

Process S37

In the process S3, further, a first average wear energy of each of the model's circumferential tread zones 23a to 23e during cornering is calculated. (Process S37)

In this process S37, the angular velocity V1a and the translational velocity V2a during free-rolling, and the angular velocity V1d and the translational velocity V2d during cornering and the turning (cornering) angle stored in the boundary condition data area 15D are read in the working memory 13C. Further, the first wear energy calculating area 16E is read in the working memory 13C, and executed by the central processing unit 13A.

As a result, in this process S37, the angular velocity V1a during free-rolling is defined on the tire model 21, and the translational velocity V2a during free-rolling is defined on the road surface model 24.

Then, the angular velocity V1d during cornering and the turning angle are defined on the tire model 21, and the translational velocity V2d during cornering is defined on the road surface model 24 in order to make it possible to calculate the tire model under such a situation that cornering is made when making free-rolling.

In the process S37, the calculation of the shearing forces Px, Py and slippages Qx, Qy at the nodes 25 is made plural times at intervals of a unit time from the beginning to the end of the cornering.

In the same way as in the process S34, the first average wear energy during cornering is calculated for each of the model's circumferential tread zones 23a to 23e, and stored in the physical quantity data area 15E.

As described above, the first average wear energies under the respective conditions (free-rolling, braking, driving and cornering) are obtained from the shearing forces Px(i), Py(i) and the slippages Qx(i), Qy(i) calculated with respect to all of the nodes 25 of the elements F(i) of the model's circumferential tread zones 23a to 23e. Therefore, it is possible to simulate the wear energy of the actual tire in which wear likely occurs continuously in the tire circumferential direction. Therefore, it becomes possible to accurately estimate the wear of the actual tire 2 in which wear occurs continuously in the tire circumferential direction in the aftermentioned wear calculating process S6.

Further, between the tire model 21 and the road surface model 24, there is defined the coefficient of friction between the actual tire 2 and road surface, therefore, it is possible to accuracy calculate the first average wear energies.

Process S4

In the method in this embodiment, occurrence frequencies of the respective rolling conditions occurring in a given running pattern of a vehicle are defined in the computer 1. (Occurrence Frequency Defining Process S4)

Corresponding to the rolling conditions, the occurrence frequencies include occurrence frequency Ca of free-rolling, occurrence frequency Cb of braking, occurrence frequency Cc of driving, and occurrence frequency Cd of cornering. In this embodiment, each occurrence frequency Ca to Cd is expressed by a percentage of the total of the Ca, Cb, Cc and Cd.

The running pattern can be obtained form an actual traveling history of a vehicle. Further, the running pattern can be an arbitrary predicted running pattern.

Figure 10:
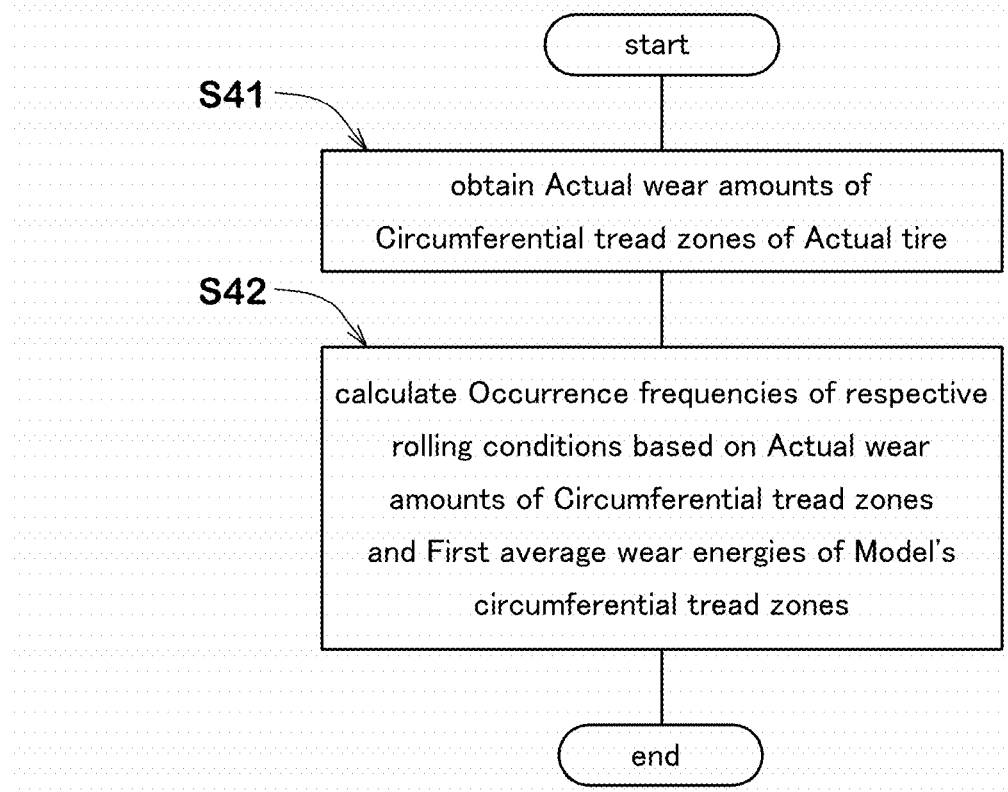
FIG. 10 is a flowchart of an occurrence frequency defining process of the method in this embodiment.

In the former case, data about the occurrence frequencies are prepared in advance, for example, through a method as shown in FIG. 10. (Processes S41 and S42)

Process S41

In process S41, an actual wear amount of each circumferential tread zone 10 of the actual tire 2 is obtained by actually rolling the tire 2.

In this example of the process S41, obtained as the actual wear amounts of the circumferential tread zones 10a to 10e, are the actual wear amounts of the circumferential grooves 9a to 9d and the tread edges 2t (2ta and 2tb).

In the process S41, the tire 2 is installed on an actual vehicle and run on various roads, for example, expressway, mountain road and public highway. After running, the tire 2 is measured for actual wear amounts of the circumferential grooves 9a to 9d and the tread edges 2ta and 2tb.

In this embodiment, differences between groove depths measured at three circumferential different measuring positions of each circumferential groove 9a to 9d and the original groove depths are averaged and determined as the actual wear amount of the concerned circumferential groove. In the case of the tread edges 2ta and 2tb, differences between radial measurements from a reference position measured at three circumferential different measuring positions of each tread edge and the original radial measurements are averaged and determined as the actual wear amount of the concerned tread edge. The determination of the actual wear amount is, of course, not limited to this manner. The obtained actual wear amounts of the circumferential grooves 9a to 9d and the tread edges 2ta and 2tb are stored in the physical quantity data area 15E as those of the circumferential tread zones 10.

Figure 11:
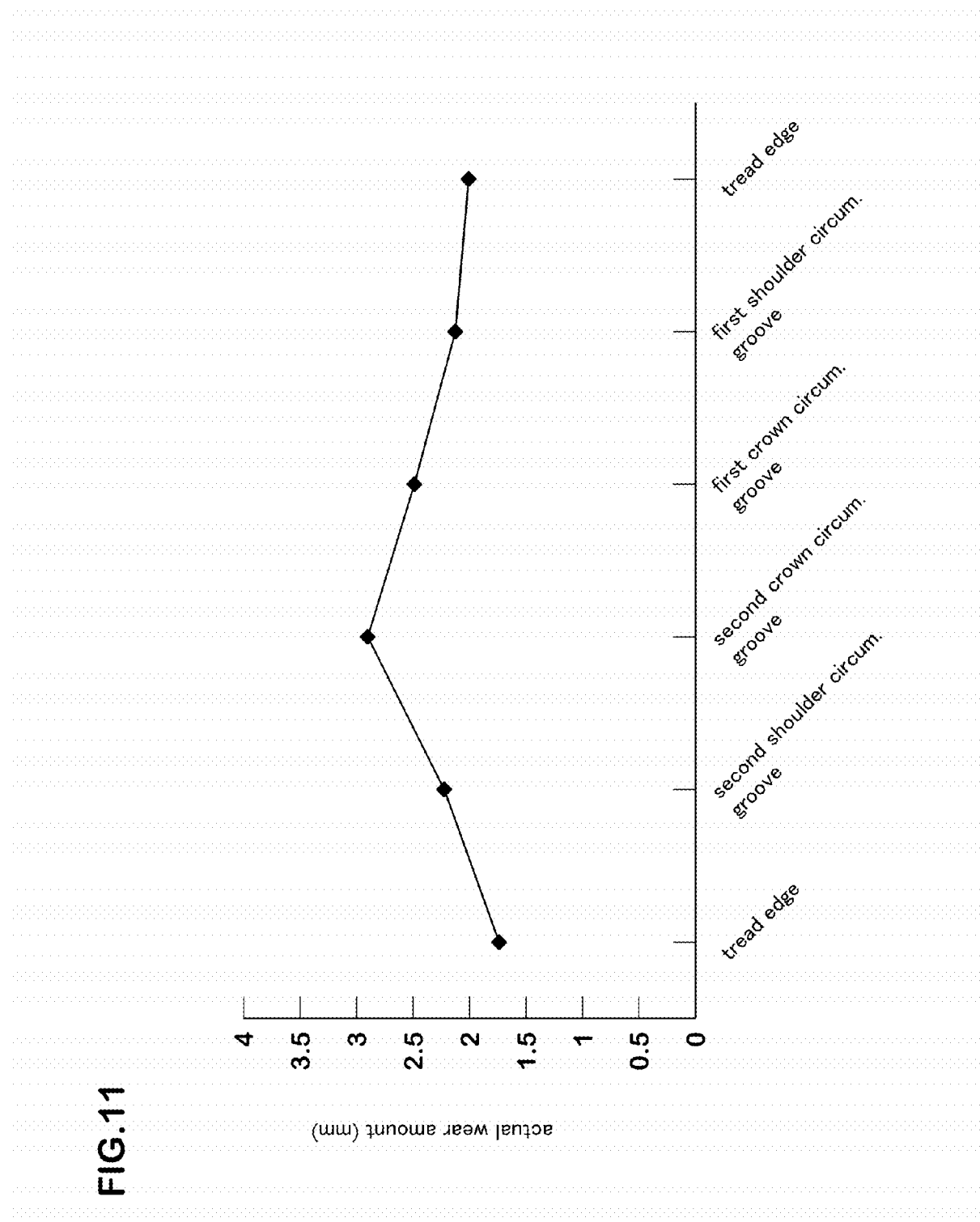
FIG. 11 is a graph showing actual wear amounts of circumferential grooves and tread edges.

FIG. 11 shows actual wear amounts of the circumferential grooves 9a to 9d and the tread edges 2ta and 2tb.

Process S42

In process S42, the occurrence frequencies Ca to Cd of the respective rolling conditions are calculated according to a multiple regression analysis method based on the actual wear amounts of the circumferential tread zones 10a to 10e and the first average wear energies of the model's circumferential tread zones 23a to 23e.

In this process S42, the actual wear amounts of the circumferential groove 9a to 9d and the tread edges 2ta and 2tb, and the first average wear energy of each of the model's circumferential tread zones 23a to 23e under each rolling condition (free-rolling, braking, driving or cornering) which are stored in the physical quantity data area 15E are read in the working memory 13C.

Further, the occurrence frequency calculating area 16F, namely, a subprogram therein for calculating occurrence frequencies of the rolling conditions of the tire 2, is read in the working memory 13C, and executed by the central processing unit 13A. As a result, based on the first average wear energies of the model's circumferential tread zones 23a to 23e, the first average wear energies of the model's circumferential grooves 22a to 22d and tread edges 21ta and 21tb are calculated.

More specifically, for each rolling condition (free-rolling, braking, driving or cornering), a first average wear energy of each model's circumferential groove 22a to 22d is obtained by averaging the first average wear energies of two model's circumferential tread zones, which are located one on each side of the concerned model's circumferential groove.

For example, for each rolling condition (free-rolling, braking, driving or cornering), the first average wear energy of the model's first crown circumferential groove 22a is obtained by averaging the first average wear energy of the model's center circumferential tread zone 23a and the first average wear energy of the model's first middle circumferential tread zone 23b. Further, for each rolling condition (free-rolling, braking, driving or cornering), a first average wear energy of each tread edge 21ta and 21tb is defined by the first average wear energy of the axially inwardly adjacent model's circumferential tread zone. For example, the first average wear energy of the model's tread edge 21ta is defined by that of the model's first shoulder circumferential tread zone 23d.

Figure 12:
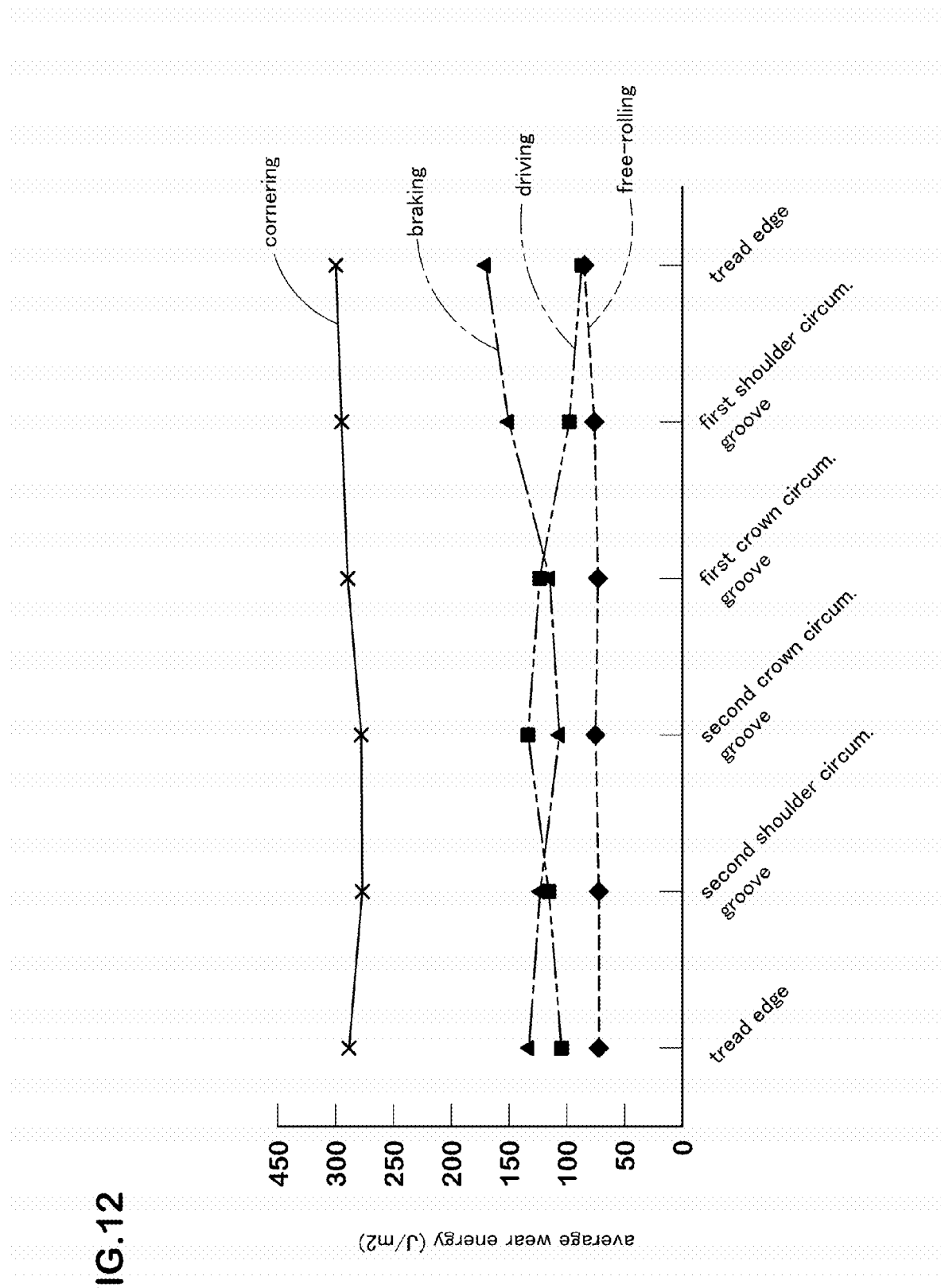
FIG. 12 is a graph showing first average wear energies of model's circumferential grooves and tread edges under each rolling condition.

FIG. 12 is a graph showing the first average wear energies of the model's circumferential grooves 22a to 22d and tread edges 21t and 21t under each rolling condition (free-rolling, braking, driving or cornering).

In this graph, for example, the first average wear energy of the model's first crown circumferential groove 22a is as follow:

during free-rolling: 65 during braking: 135 during driving: 140 during cornering: 290

The first average wear energy of the model's tread edge 21t is as follow:

during free-rolling: 80 during braking: 170 during driving: 80 during cornering: 300

In the process S42, next, a multiple linear regression analysis is made based on the first average wear energy of each model's circumferential groove 22a to 22d weighted by the occurrence frequencies Ca to Cd of the rolling conditions, the first average wear energy of each model's tread edge 21ta and 21tb weighted by the occurrence frequencies Ca to Cd of the rolling conditions, the actual wear amount of each circumferential groove 9a to 9d, and the actual wear amount of each tread edge 2ta and 2tb.

The average wear energy E1 of the model's first crown circumferential groove 22a weighted by the occurrence frequencies Ca to Cd of the rolling conditions is expressed by the following expression (1)

$$E1 = CaXE1a + CbXE1b + CcXE1c + CdXE1d \quad (1)$$

wherein $E1a$ is the first average wear energy during free-rolling of the model's first crown circumferential groove, $E1b$ is the first average wear energy during braking of the model's first crown circumferential groove, $E1c$ is the first average wear energy during driving of the model's first crown circumferential groove, and $E1d$ is the first average wear energy during cornering of the model's first crown circumferential groove.

The average wear energy E2 of the model's second crown circumferential groove 22b weighted by the occurrence frequencies Ca to Cd of the rolling conditions is expressed by the following expression (2)

$$E2 = CaXE2a + CbXE2b + CcXE2c + CdXE2d \quad (2)$$

wherein $E2a$ is the first average wear energy during free-rolling of the model's second crown circumferential groove, $E2b$ is the first average wear energy during braking of the model's second crown circumferential groove, $E2c$ is the first average wear energy during driving of the model's second crown circumferential groove, and $E2d$ is the first average wear energy during cornering of the model's second crown circumferential groove.

The average wear energy E3 of the model's first shoulder circumferential groove 22c weighted by the occurrence frequencies Ca to Cd of the rolling conditions is expressed by the following expression (3)

$$E3 = CaXE3a + CbXE3b + CcXE3c + CdXE3d \quad (3)$$

wherein $E3a$ is the first average wear energy during free-rolling of the model's first shoulder circumferential groove, $E3b$ is the first average wear energy during braking of the model's first shoulder circumferential groove, $E3c$ is the first average wear energy during driving of the model's first shoulder circumferential groove, and $E3d$ is the first average wear energy during cornering of the model's first shoulder circumferential groove.

The average wear energy E4 of the model's second shoulder circumferential groove 22d weighted by the occurrence frequencies Ca to Cd of the rolling conditions is expressed by the following expression (4)

$$E4 = CaXE4a + CbXE4b + CcXE4c + CdXE4d \quad (4)$$

wherein $E4a$ is the first average wear energy during free-rolling of the model's second shoulder circumferential groove, $E4b$ is the first average wear energy during braking of the model's second shoulder circumferential groove, E4$c$ is the first average wear energy during driving of the model's second shoulder circumferential groove, and
E4$d$ is the first average wear energy during cornering of the model's second shoulder circumferential groove.

The average wear energy E5 of the model's tread edge 21$ta$ weighted by the occurrence frequencies Ca to Cd of the rolling conditions
is expressed by the following expression (5)

$$E5 = CaXE5a + CbXE5b + CcXE5c + CdXE5d \quad (5)$$

wherein
E5$a$ is the first average wear energy during free-rolling of the model's tread edge 21$ta$,
E5$b$ is the first average wear energy during braking of the model's tread edge 21$ta$,
E5$c$ is the first average wear energy during driving of the model's tread edge 21$ta$, and
E5$d$ is the first average wear energy during cornering of the model's tread edge 21$ta$.

The average wear energy E6 of the model's tread edge 21$tb$ weighted by the occurrence frequencies Ca to Cd of the rolling conditions
is expressed by the following expression (6)

$$E6 = CaXE6a + CbXE6b + CcXE6c + CdXE6d \quad (6)$$

wherein
E6$a$ is the first average wear energy during free-rolling of the model's tread edge 21$tb$,
E6$b$ is the first average wear energy during braking of the model's tread edge 21$tb$,
E6$c$ is the first average wear energy during driving of the model's tread edge 21$tb$, and
E6$d$ is the first average wear energy of the during cornering of the model's tread edge 21$tb$.

On the premise that
the first average wear energies E1 to E4 of the respective model's circumferential grooves 22$a$ to 22$d$ weighted by the occurrence frequencies Ca to Cd of the rolling conditions
and the first average wear energies E5 and E6 of the respective tread edges 21$ta$ and 21$tb$ weighted by the occurrence frequencies Ca to Cd of the rolling conditions
are respectively equal to
the actual wear amounts of the respective circumferential grooves 9$a$ to 9$d$ and the actual wear amounts of the respective tread edges 2$t$,
the multiple linear regression analysis is performed to determine the occurrence frequencies Ca to Cd of the respective rolling conditions.
More specifically, simultaneous equations corresponding to the expressions (1)-(6) are solved to obtain unknowns Ca to Cd. For example, an analysis software "StatWorks" developed by the Institute of JUSE can be used to make the multiple linear regression analysis.

Process S5

In the method in this embodiment, next, a second average wear energy of each of the circumferential tread zones 10$a$ to 10$e$ when the tire 2 is traveled according to the above-mentioned running pattern data is calculated by the computer 1.
(Process S5)

In this process S5, the first average wear energy under each rolling condition and the occurrence frequencies Ca to Cd of the rolling conditions stored in the physical quantity data area 15E are read in the working memory 13C.
Further, the second wear energy calculating area 16G, namely, a subprogram therein for calculating the second average wear energy is read in the working memory 13C, and executed by the central processing unit 13A.

As a result, the first average wear energy of each model's circumferential tread zone 23$a$ to 23$e$ is weighted by the occurrence frequencies Ca to Cd of the rolling conditions to obtain the weighted first average wear energy as a second average wear energy.

Thus, it is possible to estimate the second average wear energy of each of the circumferential tread zones 10$a$ to 10$e$ in which the running pattern is reflected.

Such estimated second average wear energies of the circumferential tread zones 10$a$ to 10$e$ are stored in the physical quantity data area 15E.

Since the second average wear energies are determined from the first average wear energies calculated from all of the elements F(i) of the model's circumferential tread zones 23$a$ to 23$e$, it is possible to accurately estimate the wear of the actual tire 2 in which wear occurs continuously in the tire circumferential direction.

Process S6

In the method in this embodiment, next,
based on the second average wear energies of the circumferential tread zones 10$a$ to 10$e$,
estimated wear amounts of the respective circumferential tread zones 10$a$ to 10$e$ are calculated by the computer 1.
(wear calculating process S6)

In this process S6, the second average wear energy of each of the circumferential tread zones 10$a$ to 10$e$ stored in the physical quantity data area 15E is read in the working memory 13C.

Further, the wear amount calculating area 16H, namely, a subprogram for calculating the estimated wear amount of each of the circumferential tread zones 10$a$ to 10$e$ is read in the working memory 13C, and executed by the central processing unit 13A.

Figure 13:
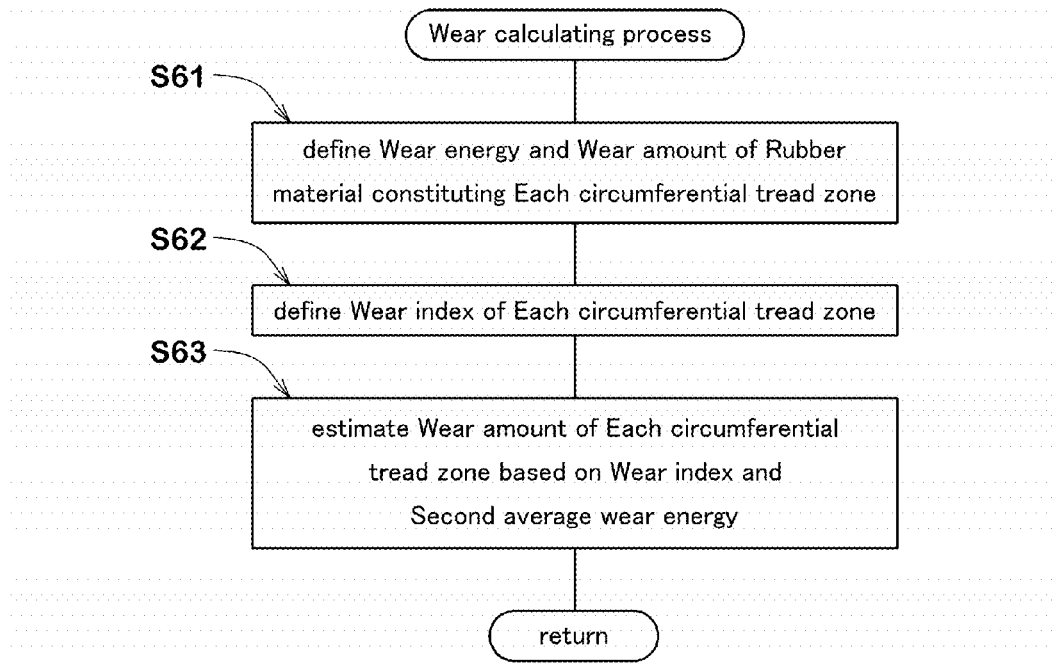
FIG. 13 is a flowchart of a wear calculating process of the method in this embodiment.

FIG. 13 is a flowchart of this process S6.

Process S61

In the process S6, a wear energy Ea and a wear amount La of a rubber material constituting each circumferential tread zone 10$a$ to 10$e$ which are determined in advance, and defined. (Process S61)

In order to determine the wear energy Ea and wear amount La, a rubber specimen (not shown) of each circumferential tread zone 10$a$ to 10$e$ of the tire 2 as shown FIG. 2 is prepared, and for example, by the use of a Lambourn test machine, the rubber specimen is measured for the amount La of wear and wear energy Ea causing the wear.

Process S62

Next, using the wear amount and wear energy, a wear index La/Ea of each circumferential tread zones 10$a$ to 10$e$ is defined. (Process S62)

The wear index La/Ea is the quotient of the wear amount La of the rubber material divided by the wear energy Ea of the rubber material of the concerned circumferential tread zone. Thus, by multiplying the wear index La/Ea by wear energy, the amount of wear can be estimated.

Process S63

Next, for each of the circumferential tread zones 10$a$ to 10$e$, an estimated wear amount is calculated by multiplying the wear index La/Ea by the second average wear energy. (Process S63)

As described above, the second average wear energies are determined from the first average wear energies calculated from all of the elements F(i) of the model's circumferential tread zones 23$a$ to 23$e$. Therefore, in the method according to the present invention, it is possible to accurately simulate the actual wear of the tire in comparison with the conventional method in which the wear is estimated based on wear energy at one axial position of the tread portion 21*a*.

Further, in the method according to the present invention, since the second average wear energies are determined based on the running pattern, the estimated wear well coincides with the actual wear.

Process S7

In the method in this embodiment, next, it is checked by the computer 1 if the estimated wear amount of each circumferential tread zone 10*a* to 10*e* is within a predetermined acceptable range. (Process S7)

Process S8

If within the acceptable range ("Y" in the process S7), the tire 2 is manufactured accordance to the tire model 21. (Process S8)

Process S9

If outside the acceptable range ("N" in the process S7), one or more design factors of the tire 2 are changed (process S9).

Then, the process S1 to process S7 are repeated.

As a result, it is possible to design the tire 2 having improved wear resistance optimized for the running pattern, Modifications In the above-described embodiment, the circumferential tread zones are actually divided in the tire axial direction by the circumferential grooves. But, this is for ease of explanation and not essential. The circumferential tread zones can be virtual zones defined by imaginary boundary lines drawn to extend straight in the tire circumferential direction regardless of the presence or absence of a tread groove.

In this connection, in the process S4, specifically, processes S41 and S42, the actual wear amounts of the circumferential grooves are used to determine the actual wear amounts of the circumferential tread zones. This is because to measure the groove depth is very easy. The actual wear amounts of the circumferential tread zones can be determined by directly measuring the wear with a suitable tool, for example, a tool for measuring a rubber thickness.

Further, in the above-described embodiment, the occurrence frequencies Ca to Cd of the rolling conditions are determined based on one actual tire 2.

But, it is also possible to determine the occurrence frequencies Ca to Cd based on two or more actual tires 2.

In this case, for example, a set of the occurrence frequencies Ca to Cd are determining based on each tire as explained above. Then, plural sets of the occurrence frequencies Ca to Cd are synthesized into one set of the occurrence frequencies Ca to Cd by averaging the respective occurrence frequencies.

If the running pattern data is prepared based on a vehicle's traveling history data for example obtained from a tachograph, the use of two or more tires 2 can lessen a possible bias of the occurrence frequencies.

Therefore, with respect to a running pattern of target tire users, wear can be accurately estimated.

Furthermore, it is also possible to determine the occurrence frequencies Ca to Cd based on generation frequencies of accelerations obtained by actually running the tire 2 rather than the actual wear amounts.

Figure 14:
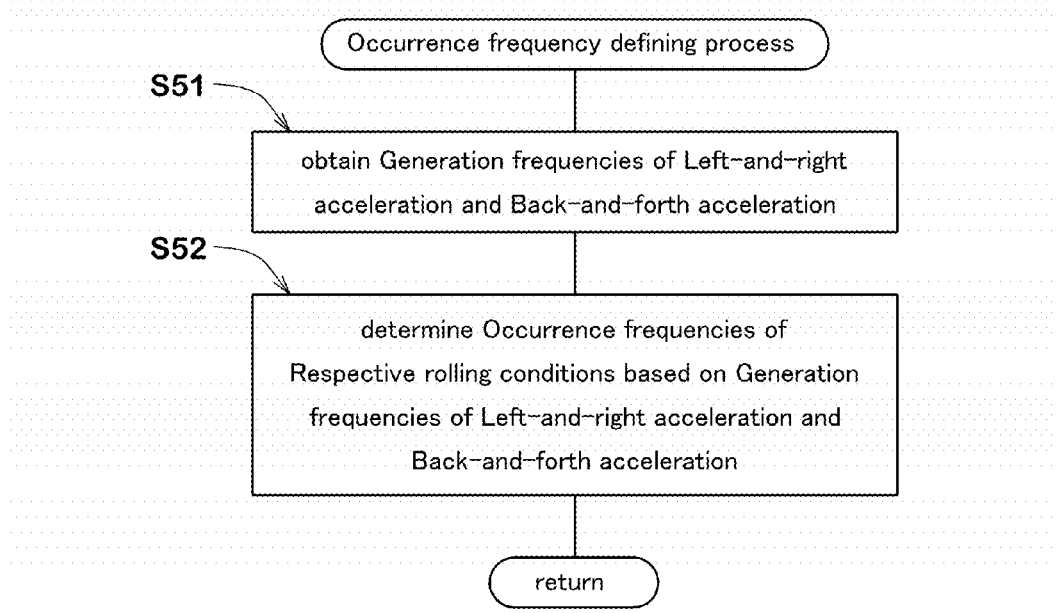
FIG. 14 is a flowchart of the occurrence frequency defining process of a method as another embodiment of the present invention.

In this case, the occurrence frequency defining process S4 is modified as shown in FIG. 14.

Process S51

In the modified process S4, firstly, left-and-right acceleration and back-and-forth acceleration applied to the tire 2 during running on actual roads (for example, including expressway, mountain road, and public highway) are measured with acceleration sensors mounted on a test vehicle, and a generation frequency (%) of the left-and-right acceleration and a generation frequency (%) of the back-and-forth acceleration are obtained. (Process S51)

The obtained generation frequencies are stored in the physical quantity data area 15E.

Figure 15:
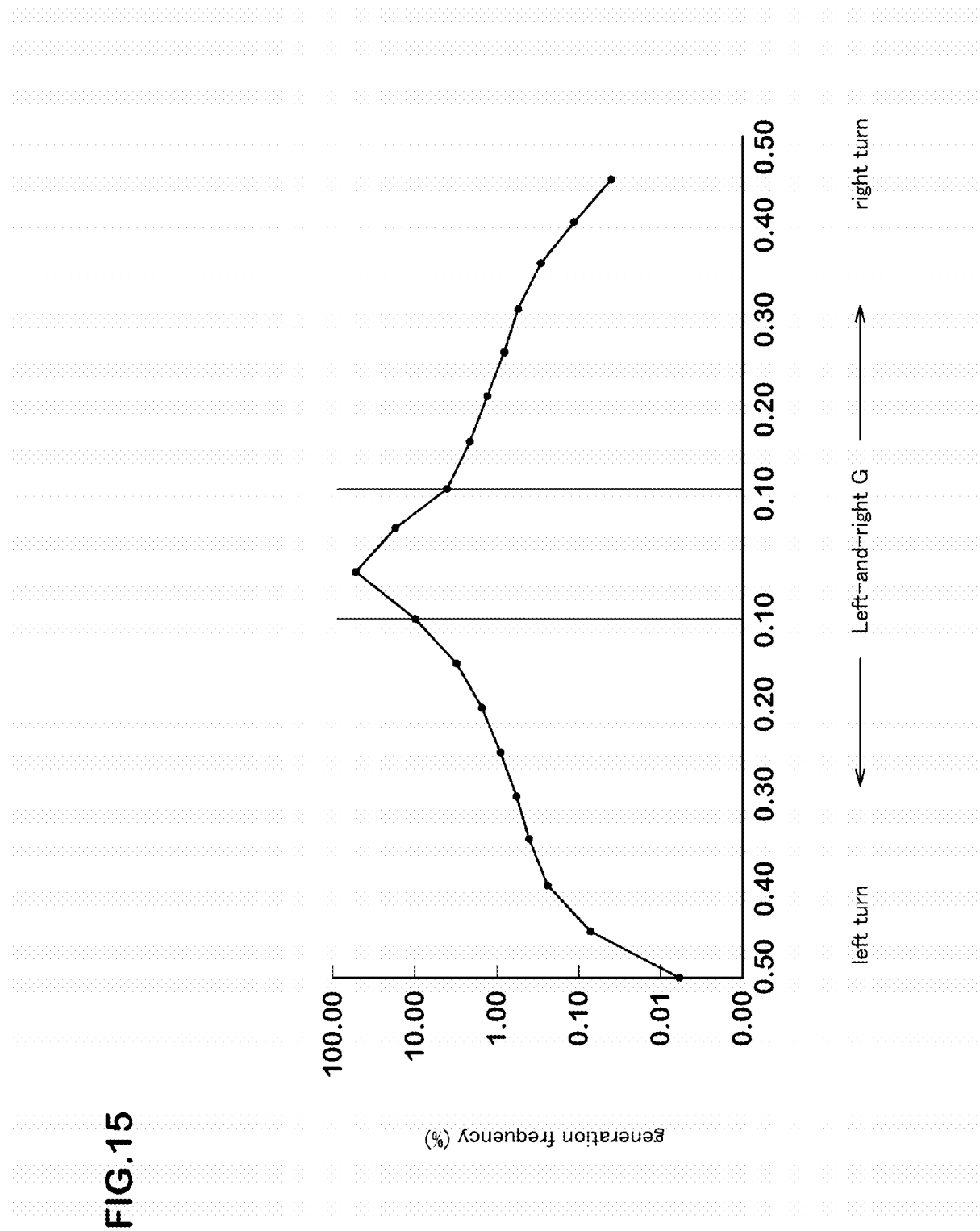
FIG. 15 is a graph showing a generation frequency of left-and-right acceleration.
Figure 16:
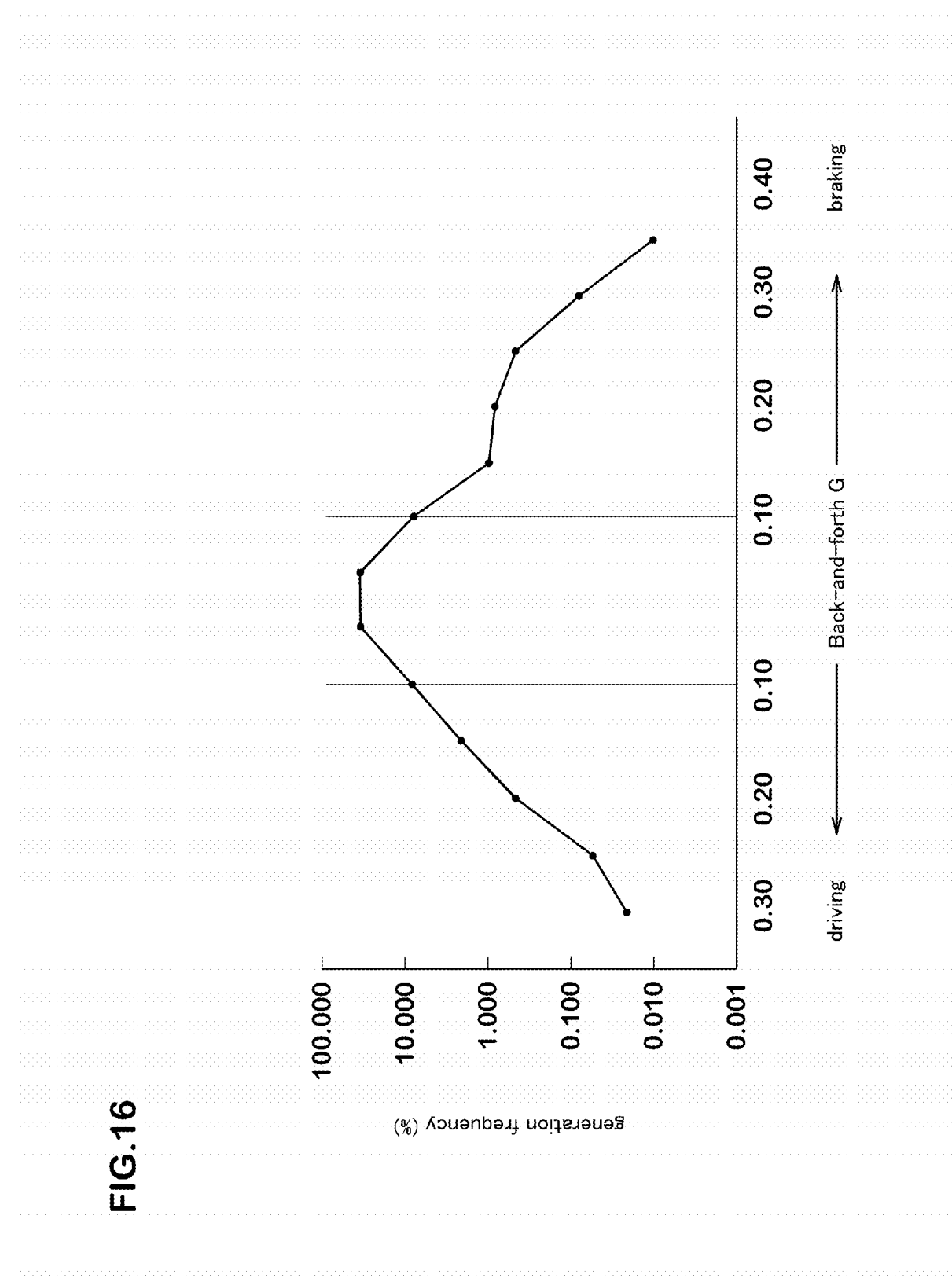
FIG. 16 is a graph showing a generation frequency of back-and-forth acceleration.

FIG. 15 and FIG. 16 show examples of the generation frequency of the left-and-right acceleration and the generation frequency of the back-and-forth acceleration, respectively.

Process S52

In the modified process S4, further, based on the generation frequencies of the left-and-right acceleration and back-and-forth acceleration, the occurrence frequencies Ca to Cd of the rolling conditions are determined. (Process S52).

In this process S52, if the left-and-right acceleration is not less than a predetermined first magnitude, the corresponding rolling is determined as cornering.

If the left-and-right acceleration is less than the first magnitude, the corresponding rolling is determined as straight running (free-rolling, braking or driving).

If the absolute value of the back-and-forth acceleration is not less than a predetermined second magnitude, the corresponding rolling is determined as braking (if minus acceleration) or driving (if plus acceleration).

If the back-and-forth acceleration is less than the second magnitude, the corresponding rolling is determined as free-rolling or cornering.

Based on such determinations of two kind of the accelerations and the generation frequencies, the occurrence frequencies Ca to Cd of the rolling conditions are determined. Thus, the first magnitude determines if the rolling is cornering. The second magnitude determines if the rolling is braking/driving. Such first magnitude and second magnitude may be arbitrarily-determined according to characteristic features of a target vehicle, usage and the like.

For example, 0.1 G is set to the first magnitude and second magnitude.

If determined in this method, the occurrence frequencies of the rolling conditions are for example as follows:
  occurrence frequency Ca of free-rolling: 48%
  occurrence frequency Cb of braking: 12%
  occurrence frequency Cc of driving: 12%
  occurrence frequency Cd of cornering: 28%

In this method, unlike the former embodiment, without performing the multiple linear regression analysis based on the actual wear amounts of the circumferential tread zones and first average wear energies of the model's circumferential tread zones, the occurrence frequencies Ca to Cd of the rolling conditions can be obtained, therefore, it is possible to reduce the computational time and cost.

Comparison Tests

According to the method (Embodiment) according to the present invention including the procedures shown in FIG. 4, FIG. 8, FIG. 10 and FIG. 14, wear of each circumferential tread zone of a tire was estimated.

In the Embodiment method, as explained above, the first wear energies of the model's circumferential tread zones were calculated based on the shearing force and slippage calculated with respect to each node of the circumferential tread zones, defining a coefficient of friction between the actual tire and a road surface on the tire model.

The occurrence frequencies of the respective rolling conditions (free-rolling, braking, driving and cornering) were determined through a multiple linear regression analysis based on the obtained first average wear energies of the model's circumferential tread zones and the actual wear amounts of the circumferential tread zones of the tire when running under the following conditions.
  tire size: 215/60 R16
  wheel rim: 16×6.5
  occurrence frequency defining process:
  running pattern: total traveling distance 20,000 km (mainly straight running)
  tire load: 3920 N
  tire inner pressure: 240 kPa
  vehicle: Japanese 2500 cc FF passenger car The wear of circumferential tread zones was estimated based on the second average wear energies obtained by weighting the first average wear energies by the occurrence frequencies.

The wear index was determined by using a Lambourn test machine.

For comparison, the wear energy of the tire was obtained according to the method (Comparative example) described in the patent document 1. In the Comparative example method, a glass plate was used as a ground contacting table on which the tire was rolled. The wear energy of the tire was measured at a one axial positions on the tread portion.

The wear of each circumferential tread zone of the tire was estimated based on the wear energy of the tire.

Figure 17:
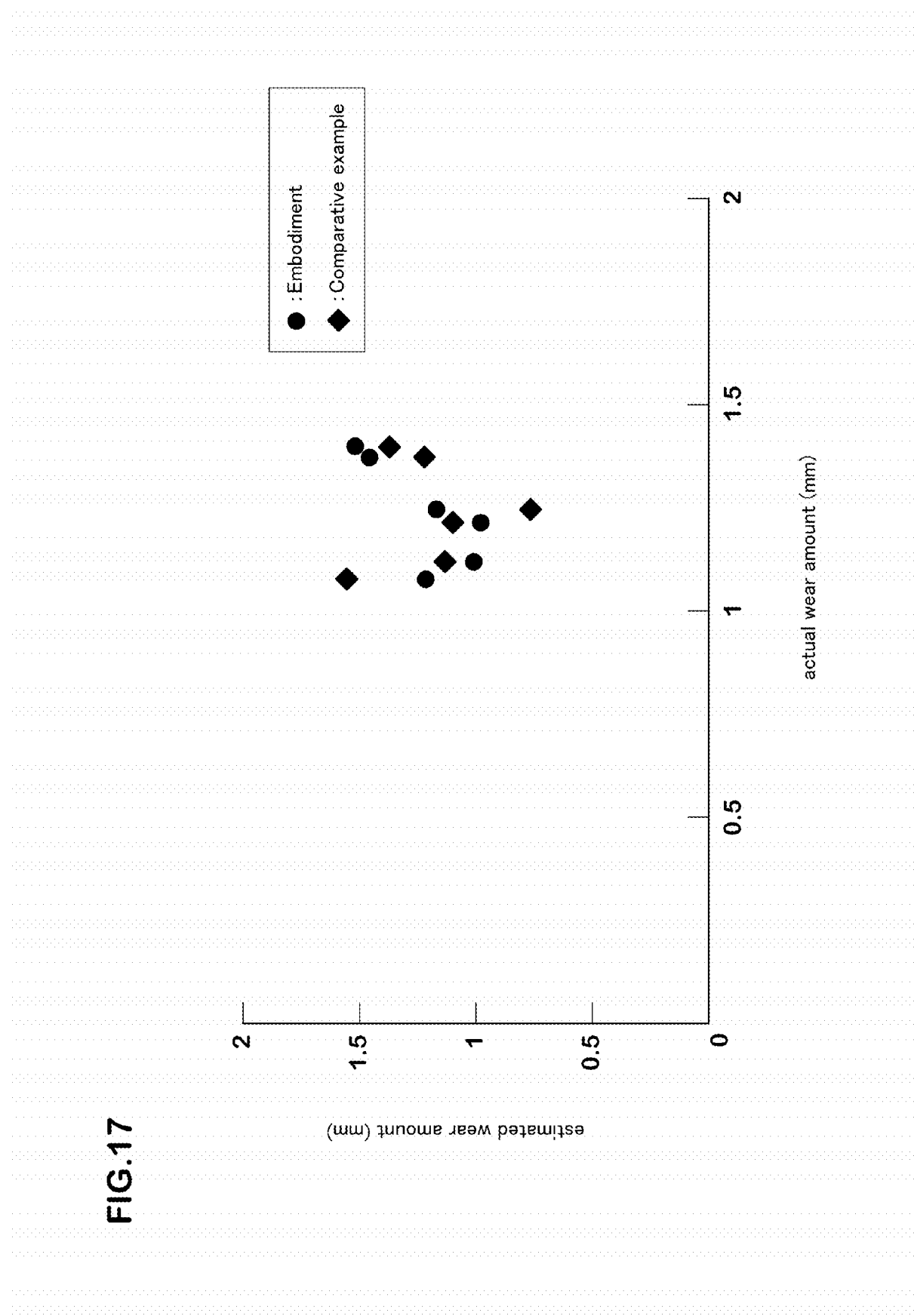
FIG. 17 is a graph showing a relationship between estimated wear amounts and actual wear amounts.

FIG. 17 shows a relationship between the actual wear amounts and the estimated wear amounts obtained by the Embodiment method (the coefficient of correlation was 0.76), and a relationship between the actual wear amounts and the estimated wear amounts obtained by the comparative example (the coefficient of correlation was −0.01).

Judged from the coefficient of correlation, it was confirmed that the Embodiment method according to the present invention can accurately estimate the wear amounts in comparison with the Comparative example method.

The invention claimed is:

1. A method for estimating wear of each of circumferential tread zones of a tread portion of a tire by the use of a computer, comprising:
  a process S1 in which a tire model of the tire made up of a finite number of elements and comprising model's circumferential tread zones of the respective circumferential tread zones is defined in the computer,
  a process S3 in which a simulation for running the tire model under respective rolling conditions for free-rolling, braking, driving and cornering is performed by the computer to obtain a first average wear energy of each model's circumferential tread zone under each rolling condition,
  an occurrence frequency defining process S4 in which, with respect to a given running pattern of the tire, occurrence frequencies of the respective rolling conditions occurring in the running pattern are defined in the computer,
  a process S5 in which, for each circumferential tread zone, a second average wear energy of the concerned circumferential tread zone when the tire is run according to the running pattern is calculated by the computer such that the first average wear energies under the respective rolling conditions, of the model's circumferential tread zone of the concerned circumferential tread zone are respectively weighted by the occurrence frequencies of the respective rolling conditions,
  a wear calculating process S6 in which, wear of each circumferential tread zone is estimated by the computer based on the calculated second average wear energy of the concerned circumferential tread zone,
  a process S7 in which whether the estimated wear of each circumferential tread zone is within a predetermined acceptable range or not is checked by the computer,
  a process S8 of manufacturing a tire accordance to the tire model when the estimated wear of each circumferential tread zone is within the acceptable range,
  a process S9 in which one or more design factors of the tire are changed when the estimated wear of each circumferential tread zone is outside the acceptable range, and
  repeating the process S1 to the process S7.

2. The method according to claim 1, wherein
the occurrence frequencies of the respective rolling conditions are determined through a multiple linear regression analysis method based on the first average wear energies of the model's circumferential tread zones, and actual wear amounts of the circumferential tread zones obtained by running the tire.

3. The method according to claim 1, wherein
the occurrence frequencies of the respective rolling conditions are determined based on a generation frequency of left-and-right acceleration applied to the tire, and a generation frequency of back-and-forth acceleration applied to the tire, which are obtained by running the tire.

4. The method according to claim 1, wherein
the wear calculating process includes
calculating an estimated wear of each circumferential tread zone by using the second average wear energy of the concerned circumferential tread zone and a wear index of a rubber material constituting the concerned circumferential tread zone, wherein the wear index is a ratio of an amount of wear of the rubber material to a wear energy causing the wear on the rubber material.

5. A computer system comprising an arithmetic processing unit for estimating wear of each of circumferential tread zones of a tread portion of a tire, wherein the arithmetic processing unit comprises:
  a tire model defining part for defining a tire model of the tire made up of a finite number of elements and comprising model's circumferential tread zones of the respective circumferential tread zones,
  a first wear energy calculating part for performing a simulation for running the tire model under respective rolling conditions for free-rolling, braking, driving and cornering, and obtaining a first average wear energy of each model's circumferential tread zone under each rolling condition,
  an occurrence frequency calculating part for defining occurrence frequencies of the respective rolling conditions occurring in a given running pattern of the tire,
  a second wear energy calculating part for calculating a second average wear energy of each circumferential tread zone when the tire is run according to the given running pattern such that the first average wear energies under the respective rolling conditions, of the model's circumferential tread zone of the concerned circumferential tread zone are respectively weighted by the occurrence frequencies of the respective rolling conditions,
  a wear amount calculating part for estimating wear of each circumferential tread zone based on the calculated second average wear energy of the concerned circumferential tread zone; and
  a determining part for determining whether the estimated wear of each circumferential tread zone is within a predetermined acceptable range or not, such that based on the determination, the tire accordance to the tire model is manufactured when the estimated wear of each circumferential tread zone is within the acceptable range, or one or more design factors of the tire are changed when the estimated wear of each circumferential tread zone is outside the acceptable range.

* * * * *